(12) United States Patent
Lee

(10) Patent No.: US 12,532,456 B2
(45) Date of Patent: Jan. 20, 2026

(54) SEMICONDUCTOR DEVICE INCLUDING CAPACITOR BLOCK

(71) Applicant: Samsung Electronics Co., Ltd., Suwon-si (KR)

(72) Inventor: Dong Kyun Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 436 days.

(21) Appl. No.: 18/062,263

(22) Filed: Dec. 6, 2022

(65) Prior Publication Data
US 2023/0328962 A1   Oct. 12, 2023

(30) Foreign Application Priority Data

Apr. 7, 2022 (KR) .................. 10-2022-0043362

(51) Int. Cl.
H10B 12/00 (2023.01)
(52) U.S. Cl.
CPC ......... *H10B 12/315* (2023.02); *H10B 12/033* (2023.02)
(58) Field of Classification Search
CPC .............................. H10B 12/03; H10B 12/033
See application file for complete search history.

(56) References Cited

U.S. PATENT DOCUMENTS

| | | |
|---|---|---|
| 6,329,683 B2 | 12/2001 | Kohyama |
| 6,734,479 B1 | 5/2004 | Ogishima et al. |
| 7,903,449 B2 | 3/2011 | Kajigaya et al. |
| 8,891,324 B2 | 11/2014 | Yi et al. |
| 10,468,415 B2 | 11/2019 | You et al. |
| 2023/0102747 A1* | 3/2023 | Yun .................. H10B 12/315 257/296 |

FOREIGN PATENT DOCUMENTS

| | | |
|---|---|---|
| CN | 114121962 A | 3/2022 |
| KR | 2000-0008804 A | 2/2000 |
| KR | 10-2004-0043955 A | 5/2004 |

OTHER PUBLICATIONS

Korean Office Action issued in Korean Patent Application No. 10-2022-0043362 Dated Oct. 15, 2025.

* cited by examiner

*Primary Examiner* — Zandra V Smith
*Assistant Examiner* — Molly K Reida
(74) *Attorney, Agent, or Firm* — Harness, Dickey & Pierce, P.L.C.

(57) ABSTRACT

A semiconductor device includes a first capacitor block including a first conductive plate, and first lower electrodes on the first conductive plate, a second capacitor block including a second conductive plate spaced apart from the first conductive plate, and second lower electrodes on the second conductive plate, a first edge capacitor block including first edge electrodes on the first conductive plate and surrounding the first capacitor block, a second edge capacitor block including a second edge electrodes on the second conductive plate and surrounding the second capacitor block and a first electrode support which supports the first lower electrodes, the second lower electrodes, the first edge electrodes, and the second edge electrodes. A first penetration pattern penetrates the first electrode support, is over the first lower electrodes and the second lower electrodes, and is not over the first edge electrodes and the second edge electrodes.

20 Claims, 33 Drawing Sheets

FIG. 4
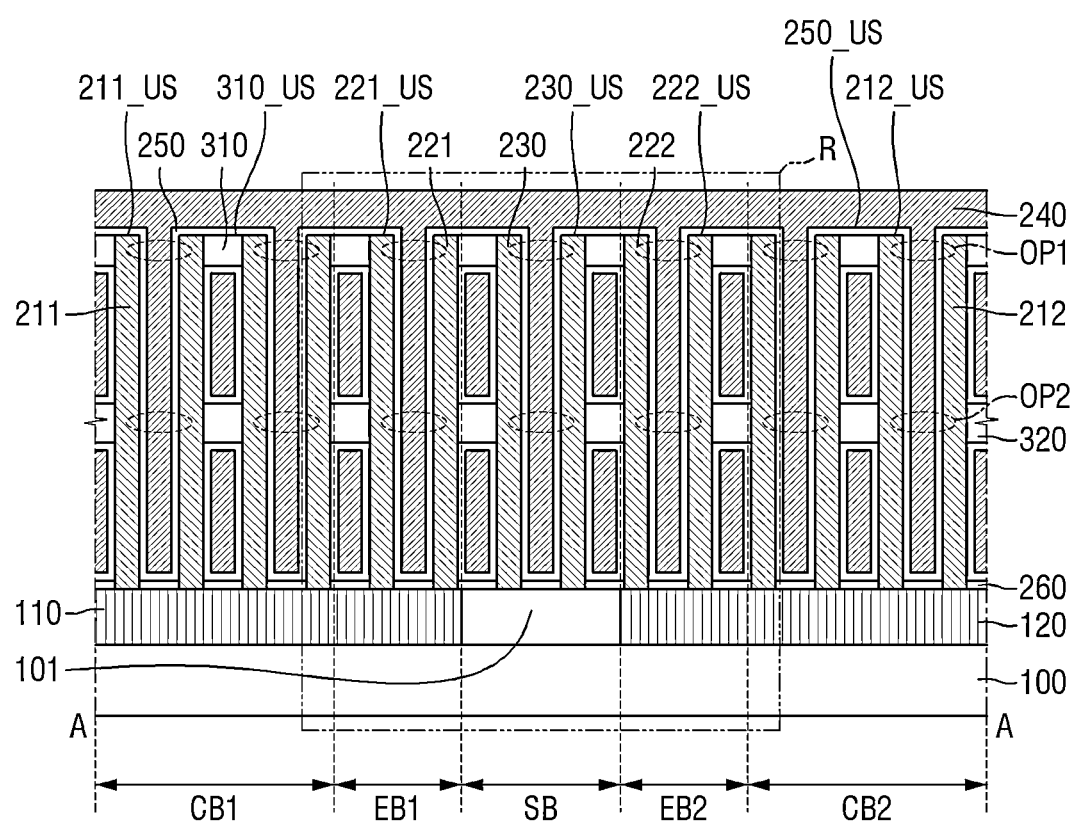
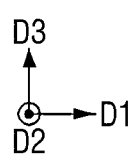

FIG. 23
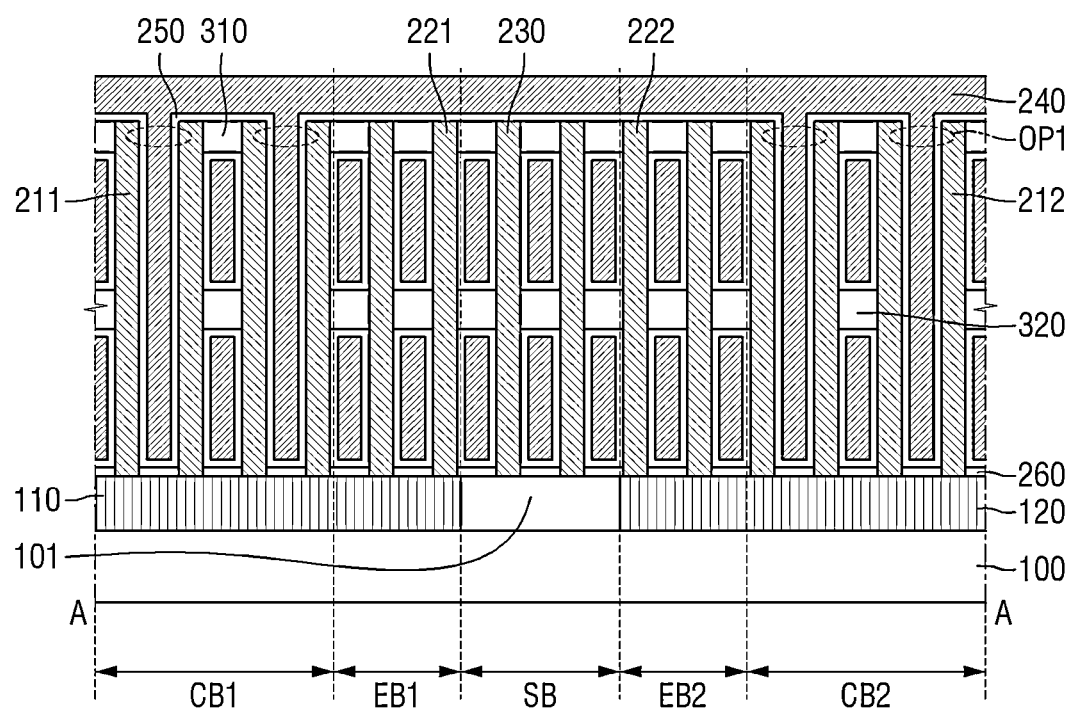
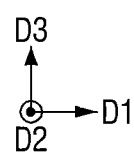

SEMICONDUCTOR DEVICE INCLUDING CAPACITOR BLOCK

This application claims priority from Korean Patent Application No. 10-2022-0043362 filed on Apr. 7, 2022 in the Korean Intellectual Property Office, and all the benefits accruing therefrom under 35 U.S.C. 119, the contents of which in its entirety are herein incorporated by reference.

BACKGROUND

Various example embodiments relate to a semiconductor device.

In electrical and electronic devices, linear devices such as memristors or capacitors are used in various applications. For example, the capacitors may be used as memory elements in a semiconductor memory device such as a DRAM. Alternatively or additionally, because the capacitors act as energy storages that store electrical energy locally in a semiconductor device, the capacitors may be used to implement a decoupling circuit that prevents or reduces noise induced in one part of the semiconductor device from affecting other parts of the device.

On the other hand, as an aspect ratio of the capacitor increases, a warpage phenomenon of the capacitor may occur in an edge region of the semiconductor device. As a result, the insulation characteristics may deteriorate, and/or when a voltage is applied to the capacitor, a leakage current may occur.

SUMMARY

Various example embodiments provide a semiconductor device having improved product reliability.

According to some aspects of various example embodiments, there is provided a semiconductor device comprising a first capacitor block which includes a first conductive plate on a substrate and a plurality of first lower electrodes on the first conductive plate, a second capacitor block which includes a second conductive plate spaced apart from the first conductive plate and a plurality of second lower electrodes on the second conductive plate, a separation block which includes a separation insulating film between the first conductive plate and the second conductive plate, and a plurality of dummy lower electrodes on the separation insulating film, and a first electrode support which supports the plurality of first lower electrodes, the plurality of second lower electrodes, and the plurality of dummy lower electrodes.

According to some aspects of various example embodiments, there is provided a semiconductor device comprising a first capacitor block which includes a first conductive plate on a substrate and a plurality of first lower electrodes on the first conductive plate, a second capacitor block which includes a second conductive plate spaced apart from the first conductive plate and a plurality of second lower electrodes on the second conductive plate, a first edge capacitor block which includes a plurality of first edge electrodes on the first conductive plate and which surrounds the first capacitor block, a second edge capacitor block which includes a plurality of second edge electrodes on the second conductive plate and which surrounds the second capacitor block and a first electrode support which supports the plurality of first lower electrodes, the plurality of second lower electrodes, the plurality of first edge electrodes, and the plurality of second edge electrodes. The first electrode support includes a first penetration pattern that penetrates the first electrode support, and the first penetration pattern is arranged over the plurality of first lower electrodes and the plurality of second lower electrodes, and is not over the plurality of first edge electrodes and the plurality of second edge electrodes.

According to some aspects of various example embodiments, there is provided a semiconductor device comprising a first capacitor block which includes a first conductive plate on a substrate and a plurality of first lower electrodes on the first conductive plate, a second capacitor block which includes a second conductive plate spaced apart from the first conductive plate and a plurality of second lower electrodes on the second conductive plate, a first edge capacitor block which includes a plurality of first edge electrodes on the first conductive plate and surrounds the first capacitor block, a second edge capacitor block that includes a plurality of second edge electrodes on the second conductive plate and surrounds the second capacitor block, a separation block which includes a separation insulating film between the first conductive plate and the second conductive plate, and a plurality of dummy lower electrodes on the separation insulating film, a first electrode support that supports each of the plurality of first lower electrodes, the plurality of second lower electrodes, the plurality of first edge electrodes, the plurality of second edge electrodes, and the plurality of dummy lower electrodes, and includes a first penetration pattern and a second electrode support which supports the plurality of first lower electrodes, the plurality of second lower electrodes, the plurality of first edge electrodes, the plurality of second edge electrodes and the plurality of dummy lower electrodes, includes a second penetration pattern which completely overlaps the first penetration pattern, and is placed between the substrate and the first electrode support. The first penetration pattern is over the plurality of first lower electrodes and the plurality of second lower electrodes, and the first penetration pattern is not over the plurality of first edge electrodes, the plurality of second edge electrodes, and the plurality of dummy lower electrodes.

However, aspects of various example embodiments are not restricted to the one set forth herein. The above and other aspects will become more apparent to one of ordinary skill in the art to which example embodiments pertain by referencing the detailed description given below.

BRIEF DESCRIPTION OF THE DRAWINGS

The above and other aspects and features of various example embodiments will become more apparent by describing in detail example embodiments thereof with reference to the attached drawings, in which:

FIG. 4 is an example cross-sectional view taken along A-A of FIG. 3.

FIG. 23 is an example cross-sectional view taken along A-A of FIG. 22.

DETAILED DESCRIPTION OF VARIOUS EXAMPLE EMBODIMENTS

Hereinafter, various example embodiments according to the technical idea of inventive concepts will be described referring to the accompanying drawings.

Figure 1:
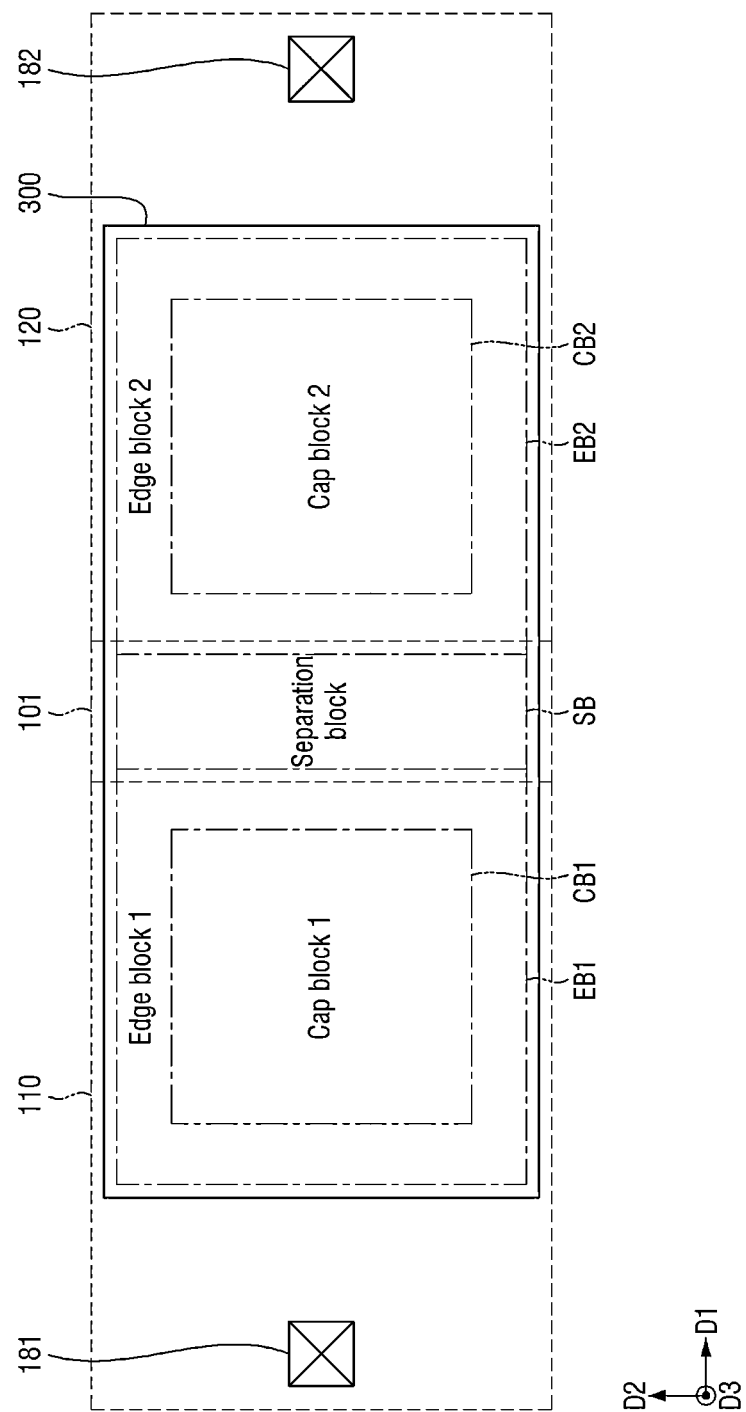
FIG. 1 is an example layout diagram for explaining a semiconductor device according to some example embodiments of inventive concepts.
Figure 2:
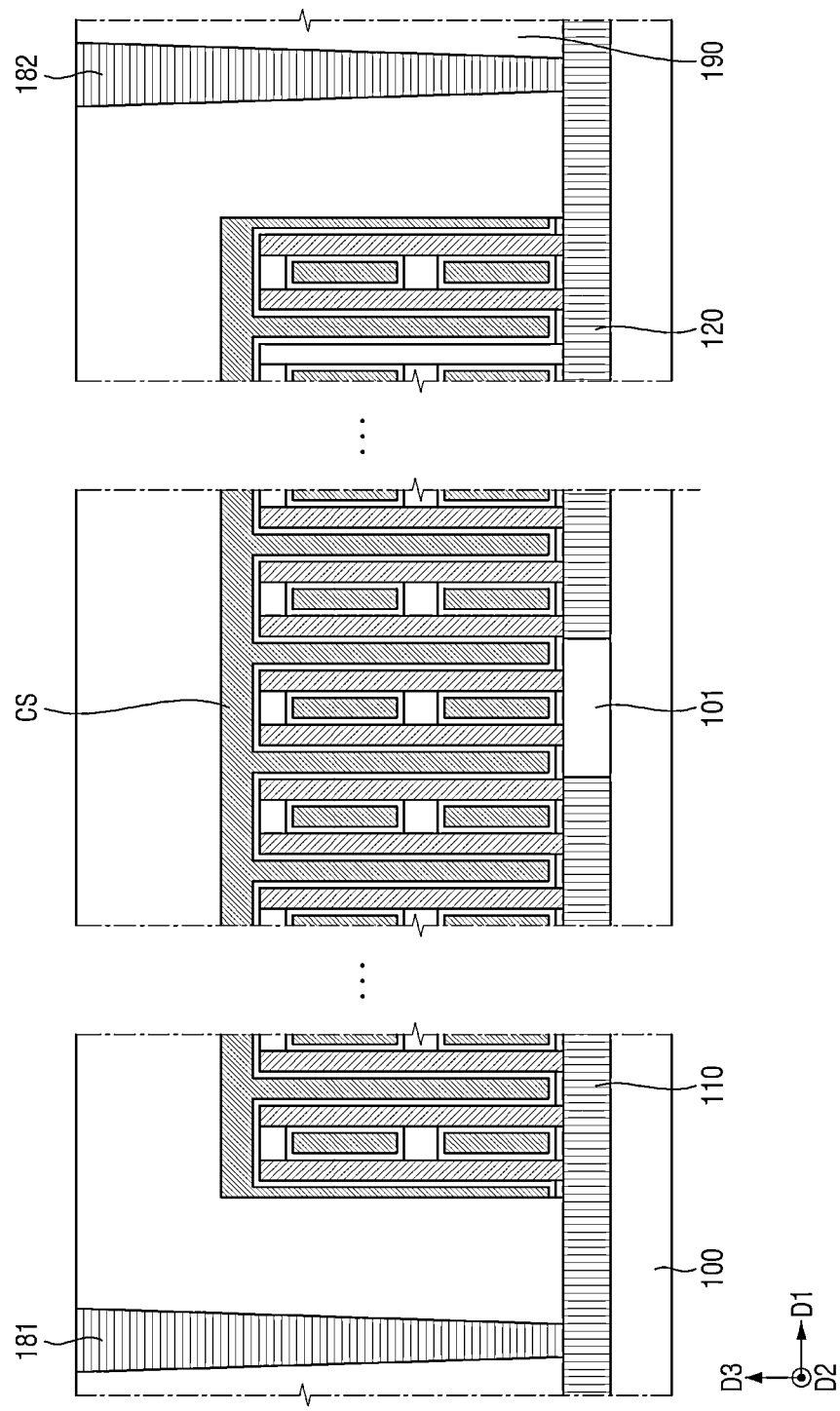
FIG. 2 is cross-sectional view for explaining the semiconductor device according to some example embodiments of inventive concepts.
Figure 3:
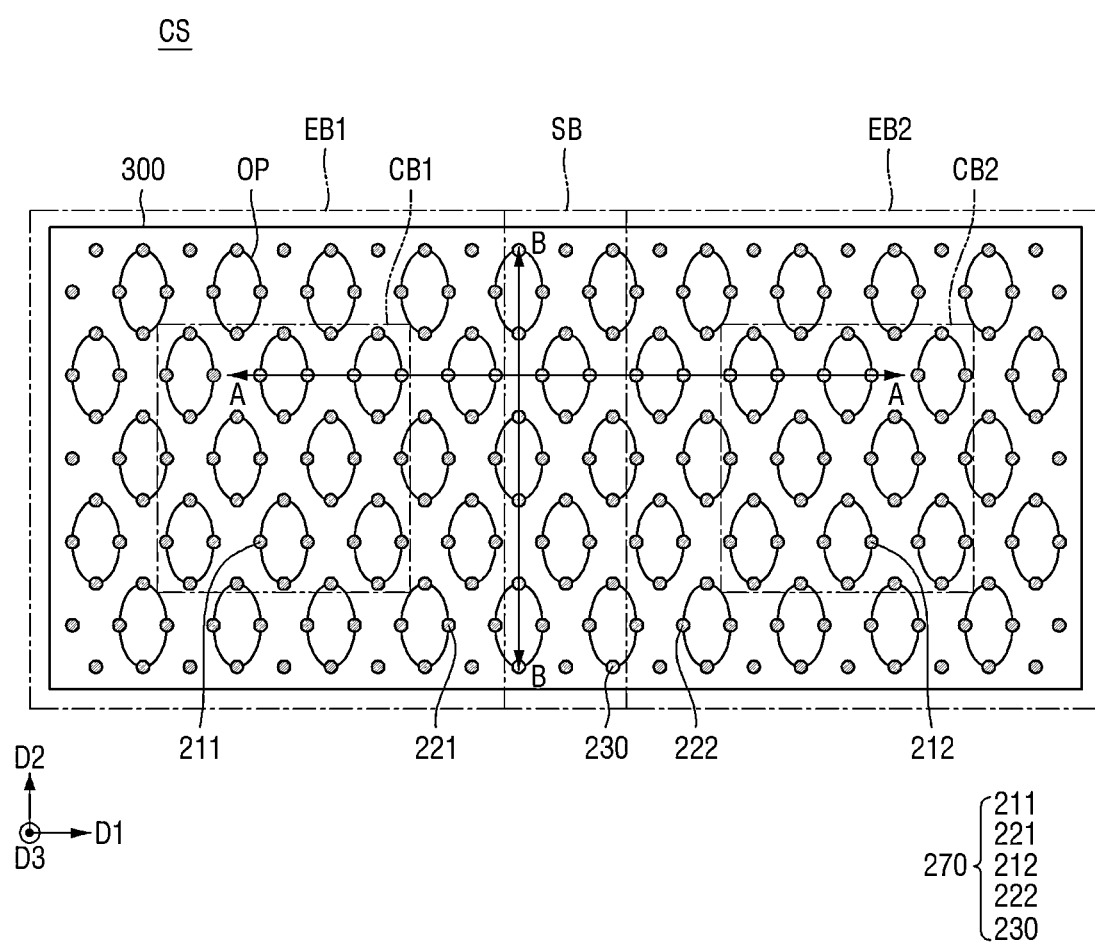
FIG. 3 is an example plan view for explaining a capacitor structure according to some example embodiments of inventive concepts.
Figure 5:
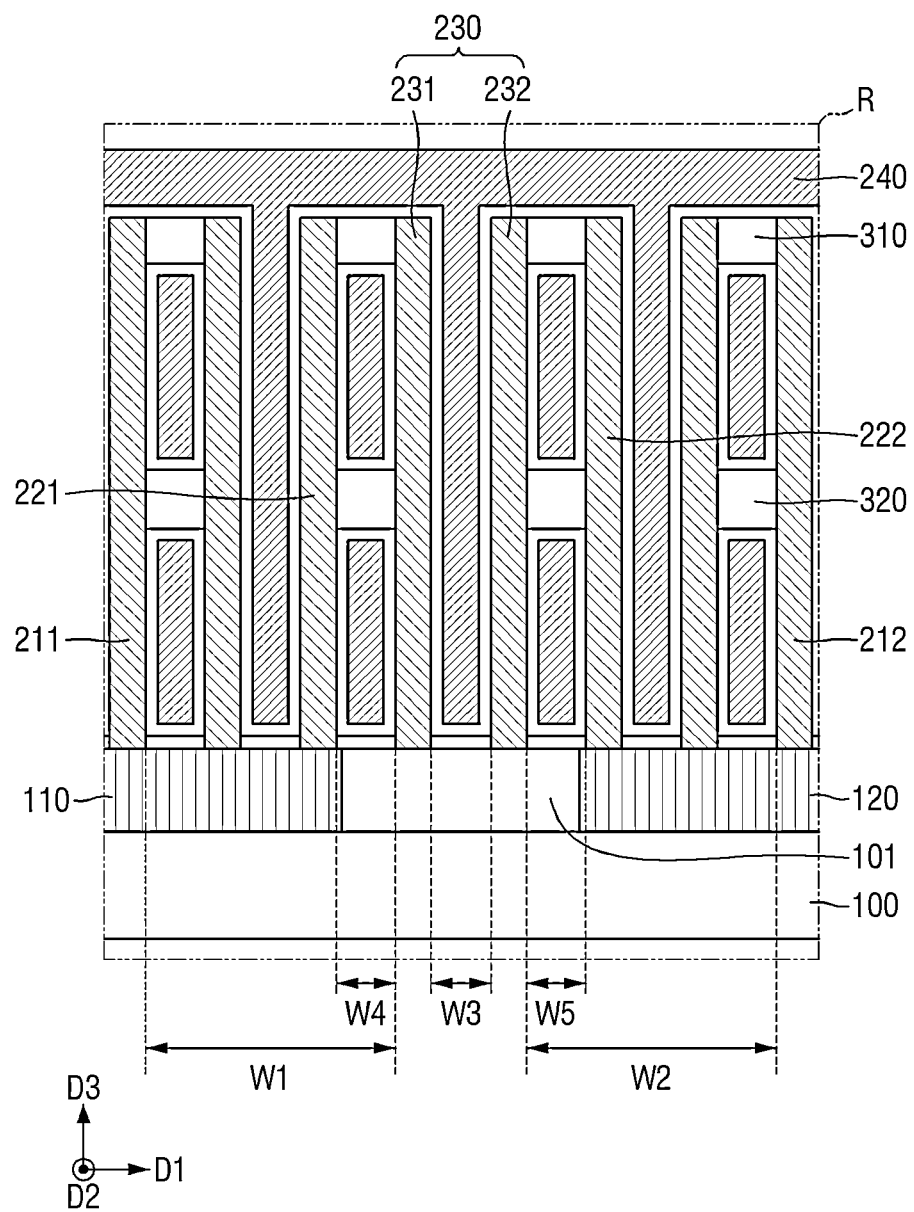
FIG. 5 is an enlarged view showing a region R of FIG. 4.
Figure 6:
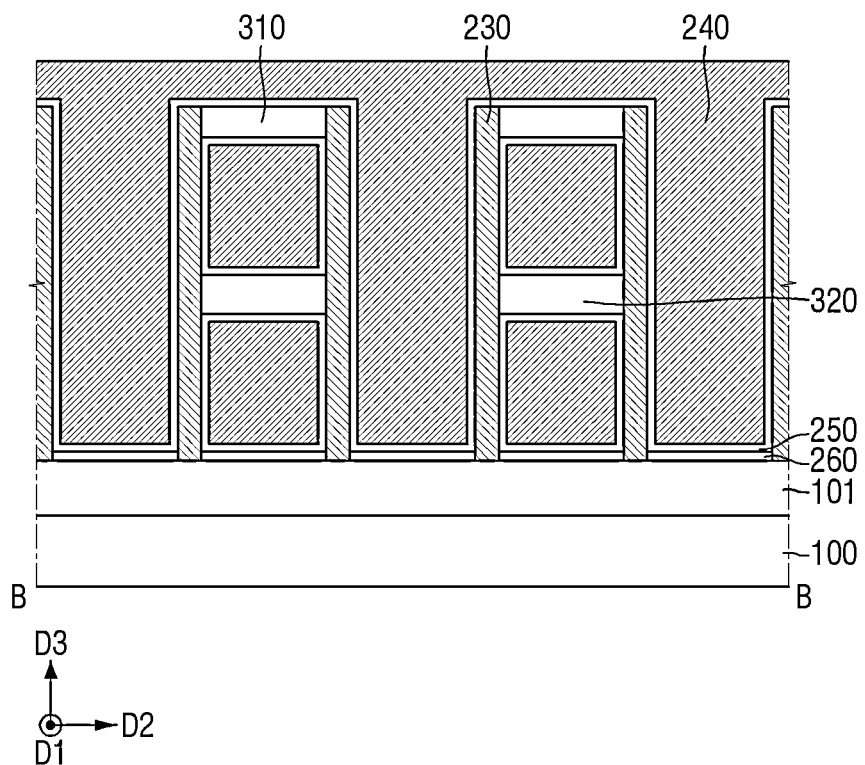
FIG. 6 is an example cross-sectional view taken along B-B of FIG. 3.

FIG. 1 is an example layout diagram for explaining a semiconductor device according to some example embodiments of inventive concepts. FIG. 2 is cross-sectional view for explaining the semiconductor device according to some example embodiments of inventive concepts. FIG. 3 is an example plan view for explaining a capacitor structure according to some example embodiments of inventive concepts. FIG. 4 is an example cross-sectional view taken along A-A of FIG. 3. FIG. 5 is an enlarged view showing a region R of FIG. 4. FIG. 6 is an example cross-sectional view taken along B-B of FIG. 3.

Referring to FIGS. 1 and 2, the semiconductor device according to some example embodiments may include a substrate 100, a first conductive plate 110, a second conductive plate 120, a separation insulating film 101, a capacitor structure CS, a first contact 181, a second contact 182, and an interlayer insulating film 190.

The capacitor structure CS may include a first capacitor block CB1, a second capacitor block CB2, a separation block SB, a first edge capacitor block EB1, and a second edge capacitor block EB2.

The substrate 100 may be or may include, for example, a silicon single crystal substrate and/or an SOI (Silicon on Insulator) substrate. In contrast, the substrate 100 may be or include, but is not limited to, silicon germanium, silicon germanium on-insulator (SGOI), indium antimonide, lead tellurium compounds, indium arsenic, indium phosphide, gallium arsenide or gallium antimonide. The semiconductor substrate 100 may be doped, or may be undoped.

The first conductive plate 110 and the second conductive plate 120 may be placed on the substrate 100. The first conductive plate 110 and the second conductive plate 120 may extend in a first direction D1 and a second direction D2 in a plane on which the first direction D1 and the second direction D2 extend. The first conductive plate 110 and the second conductive plate 120 may include a conductive substance.

The first conductive plate 110 and the second conductive plate 120 may be electrically connected to the capacitor structure CS. For example, the first conductive plate 110 may be electrically connected to the first capacitor block CB1 and the first edge capacitor block EB1 of the capacitor structure CS. The second conductive plate 120 may be electrically connected to the second capacitor block CB2 and the second edge capacitor block EB2 of the capacitor structure CS.

The first conductive plate 110 and the second conductive plate 120 may be or may include a single film, but inventive concepts are not limited thereto. The first conductive plate 110 and the second conductive plate 120 may be a multiple-film. The first conductive plate 110 and the second conductive plate 120 may include, but are not limited to, for example, polysilicon such as doped polysilicon, TiSiN, tungsten (W), and combinations thereof.

The separation insulating film 101 may be placed on the substrate 100. The separation insulating film 101 may be placed between the first conductive plate 110 and the second conductive plate 120. The separation insulating films 101 may each include an insulating material. For example, the separation insulating film 101 may include at least one of a silicon nitride film, a silicon oxynitride film, a silicon oxide film, and a combination thereof.

The first contact 181 and the second contact 182 may extend in a third direction D3 perpendicular to the substrate 100 inside the interlayer insulating film 190. The interlayer insulating film 190 may surround the first contact 181 and the second contact 182. The interlayer insulating film 190 may be placed on the substrate 100, the first conductive plate 110, the second conductive plate 120, and the separation insulating film 101. The interlayer insulating film 190 may cover the capacitor structure CS.

The first contact 181 may extend in the third direction D3 on or onto the first conductive plate 110. The first contact 181 may be electrically connected to the first capacitor block CB1 and the first edge capacitor block EB1 through the first conductive plate 110. For example, the first contact 181 may be configured to apply a first voltage to the first capacitor block CB1 and the first edge capacitor block EB1 through the first conductive plate 110.

The second contact 182 may extend in the third direction D3 on the second conductive plate 120. The second contact 182 may be electrically connected to the second capacitor block CB2 and the second edge capacitor block EB2 through the second conductive plate 120. For example, the second contact 182 may be configured to apply a second voltage to the second capacitor block CB2 and the second edge capacitor block EB2 through the second conductive plate 120. The first voltage may be the same as, or different from, the second voltage.

The capacitor structure CS may be placed on the substrate 100. The capacitor structure CS may be placed on the first conductive plate 110, the second conductive plate 120, and the separation insulating film 101.

For example, the first capacitor block CB1 may be placed on the first conductive plate 110. The first edge capacitor block EB1 may be placed on the first conductive plate 110. The second capacitor block CB2 may be placed on the second conductive plate 120. The second edge capacitor block EB2 may be placed on the second conductive plate 120. The separation block SB may be placed on the separation insulating film 101.

The capacitor structure CS may be placed between the first contact 181 and the second contact 182. The capacitor structure CS may be placed apart from the first contact 181 and the second contact 182 in the first direction D1.

The first edge capacitor block EB1 may surround the first capacitor block CB1 (for example, in a plan view). The second edge capacitor block EB2 may surround the second capacitor block CB2 (for example, in a plan view).

The first edge capacitor block EB1 and the second edge capacitor block EB2 may be spaced apart from each other in the first direction D1. In the first direction D1, the separation block SB may be placed between the first edge capacitor block EB1 and the second edge capacitor block EB2.

The first edge capacitor block EB1 and the second edge capacitor block EB2 may be spaced apart from each other with the separation block SB interposed between them. For example, the separation block SB may be placed between the first edge capacitor block EB1 and the second edge capacitor block EB2.

The first capacitor block CB1 and the second capacitor block CB2 may be spaced apart from each other in the first direction D1. In the first direction D1, the separation block SB may be placed between the first capacitor block CB1 and the second capacitor block CB2.

The first capacitor block CB1 and the second capacitor block CB2 may be spaced apart from each other with the separation block SB interposed between them. For example, the separation block SB may be placed between the first capacitor block CB1 and the second capacitor block CB2.

Referring to FIG. 3, the capacitor structure CS may include a plurality of lower electrodes 270. The plurality of lower electrodes 270 may include a plurality of first lower electrodes 211, a plurality of second lower electrodes 212, a plurality of first edge electrodes 221, a plurality of second edge electrodes 222, and a plurality of dummy lower electrodes 230. The plurality of lower electrodes 270 may be aligned in the first direction D1 and the second direction D2.

The first capacitor block CB1 may include a plurality of first lower electrodes 211. The second capacitor block CB2 may include a plurality of second lower electrodes 212. The first edge capacitor block EB1 may include a plurality of first edge electrodes 221. The second edge capacitor block EB2 may include a plurality of second edge electrodes 222. The separation block SB may include a plurality of dummy lower electrodes 230.

The dummy lower electrodes 230 may not be electrically active during operation of the semiconductor device. For example, during operation of the semiconductor device, one or more of the first lower electrodes 211 and the second lower electrodes 212 may store charge, while the dummy lower electrodes 230 may not store charge, and may, for example, electrically float. The dummy lower electrodes 230 may support structural properties of the semiconductor device.

The plurality of lower electrodes 270 may include, for example, but not limited to, a doped semiconductor material, a conductive metal nitride (e.g., titanium nitride, tantalum nitride, niobium nitride or tungsten nitride, etc.), a metal (e.g., ruthenium, iridium, titanium, or tantalum, etc.), and a conductive metal oxide (e.g., iridium oxide or niobium oxide, etc.).

The capacitor structure CS may include the support structure 300. For example, the first capacitor block CB1, the second capacitor block CB2, the first edge capacitor block EB1, the second edge capacitor block EB2, and the separation block SB may overlap the support structure 300.

The support structure 300 may include a penetration pattern OP. The penetration pattern OP may be formed in the first capacitor block CB1, the second capacitor block CB2, the first edge capacitor block EB1, the second edge capacitor block EB2, and the separation block SB.

The penetration pattern OP may at least partially overlap some of the plurality of electrodes including the first lower electrodes 211, the second lower electrodes 212, the first edge electrodes 221, the second edge electrodes 222, and the dummy electrodes 230. For example, the penetration pattern OP may be formed over a plurality of electrodes.

For example, in the first capacitor block CB1, the penetration pattern OP may be formed over, for example, four first lower electrodes 211. In the second capacitor block CB2, the penetration pattern OP may be formed over, for example, four second lower electrodes 212. In the first edge capacitor block EB1, the penetration pattern OP may be formed over, for example, four first edge electrodes 221. In the second edge capacitor block EB2, the penetration pattern OP may be formed over, for example, four second edge electrodes 222. In the separation block SB, the penetration pattern OP may be formed over the four dummy lower electrodes 230.

Although the penetration pattern OP is shown to be formed over the four lower electrodes in FIG. 3, the embodiments are not limited thereto. For example, the penetration pattern OP may be formed over three lower electrodes. In another example, the penetration pattern OP may be formed over six lower electrodes.

Referring to FIGS. 3 to 6, the semiconductor device according to some example embodiments may be divided into a first capacitor block CB1 region, a first edge capacitor block EB1 region, a separation block SB region, a second edge capacitor block EB2 region and a second capacitor block CB2 region from the viewpoint of a cross-sectional view.

In some example embodiments, the semiconductor device according to some example embodiments may include a plurality of lower electrodes 270, upper electrodes 240, and support structures 300.

The plurality of first lower electrodes 211 may be placed on the first conductive plate 110 in the first capacitor block CB1 region. The plurality of first lower electrodes 211 may extend in the third direction D3 perpendicular to the substrate 100 on the first conductive plate 110. The plurality of second lower electrodes 212 may be placed on the second conductive plate 120 in the second capacitor block CB2 region. The plurality of second lower electrodes 212 may extend in the third direction D3 perpendicular to the substrate 100 on the second conductive plate 120.

The plurality of first edge electrodes 221 may be placed on the first conductive plate 110 in the first edge capacitor block EB1 region. The plurality of second edge electrodes 222 may be placed on the second conductive plate 120 in the second edge capacitor block EB2 region. Similarly, the plurality of first edge electrodes 221 and the plurality of second edge electrodes 222 may extend in the third direction D3 perpendicular to the substrate 100.

The plurality of dummy lower electrodes 230 may be placed on the separation insulating film 101 in the separation block SB region. The plurality of dummy lower electrodes 230 may extend in the third direction D3 perpendicular to the substrate 100.

The plurality of dummy lower electrodes 230 may fill a space between the first edge capacitor block EB1 and the second edge capacitor block EB2 on the separation insulating film 101. The plurality of dummy lower electrodes 230 may not be electrically connected to the first conductive plate 110 and the second conductive plate 120.

The first lower electrode 211 and the first dummy lower electrode 231 closest to the separation block SB may be spaced apart from each other by a first interval W1. The second lower electrode 212 and the second dummy lower electrode 232 closest to the separation block SB may be spaced apart from each other by a second interval W2. At this time, the first interval W1 and the second interval W2 may be equal to each other.

The first edge electrode 221 and the first dummy lower electrode 231 adjacent to each other may be spaced apart from each other by a fourth interval W4. The second edge electrode 222 and the second dummy lower electrode 232 adjacent to each other may be spaced apart from each other by a fifth interval W5. At this time, the fourth interval W4 and the fifth interval W5 may be equal to each other.

The first dummy lower electrode 231 and the second dummy lower electrode 232 that are adjacent to each other may be spaced apart from each other by a third interval W3.

The support structure 300 may include a first electrode support 310 and a second electrode support 320. The first electrode support 310 may have a plate-like shape extending in a direction parallel to the upper surface of the substrate 100. For example, the first electrode support 310 may be or may correspond to or include an electrode support placed at the uppermost part among the electrode supports included in the first capacitor structure CS.

The first electrode support 310 may come into contact with the side walls of the plurality of lower electrodes 270. The first electrode support 310 may support a plurality of lower electrodes 270.

The first electrode support 310 may prevent, or reduce the likelihood of occurrence of and/or the impact from occurrence, of, the plurality of lower electrodes 270 extending long in the third direction D3 from tilting and/or falling each other. The plurality of lower electrodes 270 extend in the thickness direction of the first electrode support 310.

The first electrode support 310 may include an insulating material. The first electrode support portion 310 may include, for example, at least one of silicon nitride (SiN), silicon carbonitride (SiCN), silicon boronitride (SiBN), silicon oxycarbide (SiOC), silicon oxynitride (SiON), silicon oxide (SiO), and silicon oxycarbonitride (SiOCN).

The first electrode support 310 may include a plurality of first penetration patterns OP1 that penetrate the first electrode support 310.

An uppermost surface of the plurality of lower electrodes 270 may be placed on the same plane as (be coplanar with) an uppermost surface 310_US of the first electrode support 310. An uppermost surface 211_US of the first lower electrode 211 may be placed on the same plane as (be coplanar with) the uppermost surface 310_US of the first electrode support 310. An uppermost surface 212_US of the plurality of second lower electrodes 212 may be placed on the same plane as (be coplanar with) the uppermost surface 310_US of the first electrode support 310. The uppermost surface 211_US of the plurality of first edge electrodes 221 may be placed on the same plane (be coplanar with) as the uppermost surface 310_US of the first electrode support 310. An uppermost surface 222_US of the plurality of second edge electrodes 222 may be placed on the same plane as (be coplanar with) the uppermost surface 310_US of the first electrode support 310. An uppermost surface 230_US of the plurality of dummy lower electrodes 230 may be placed on the same plane as (be coplanar with) the uppermost surface 310_US of the first electrode support 310.

The second electrode support 320 may be placed between the substrate 100 and the first electrode support 310. The second electrode support 320 may have a plate-like shape extending in a direction parallel to the upper surface of the substrate 100.

The second electrode support 320 may come into contact with side walls of the plurality of lower electrodes 270. The second electrode support 320 may support the plurality of lower electrodes 270.

The second electrode support 320 may include a plurality of second penetration patterns OP2 that penetrate the second electrode support 320. The second penetration pattern OP2 may be formed at a position corresponding to the first penetration pattern OP1. The second penetration pattern OP2 may overlap the first penetration pattern OP1 in the third direction D3.

The second electrode support 320 may include, for example, at least one of silicon nitride (SiN), silicon carbonitride (SiCN), silicon boronitride (SiBN), silicon oxycarbide (SiOC), silicon oxynitride (SiON), silicon oxide (SiO), and silicon oxycarbonitride (SiOCN).

Unlike those shown, in some example embodiments, the capacitor structure CS may not include the second electrode support 320. Alternatively or additionally, the capacitor structure CS may further include an additional electrode support between the substrate 100 and the first electrode support 310.

The penetration pattern OP may be placed to be spaced apart at equal intervals in the first capacitor block CB1, the first edge capacitor block EB1, the separation block SB, the second edge capacitor block EB2, and the second capacitor block CB2.

A capacitor dielectric film 250 may be formed on the plurality of lower electrodes 270, the first electrode support 310, and the second electrode support 320. The capacitor dielectric film 250 may extend along profiles of the plurality of lower electrodes 270, the upper surface 310_US of the first electrode support, the lower surface of the first electrode support 310, the upper surface of the second electrode support 320, and the lower surface of the second electrode support 320. The capacitor dielectric film 250 may include, for example, but not limited to, at least one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. Although the capacitor dielectric film 250 is shown as a single film, this is only for convenience of explanation, and various example embodiments are not limited thereto.

In the semiconductor device according to some example embodiments, the capacitor dielectric film 250 may include a stacked film structure in which zirconium oxide, aluminum oxide, and zirconium oxide are sequentially stacked, e.g. in any order.

In the semiconductor device according to some example embodiments, the capacitor dielectric film 250 may include a dielectric film including hafnium (Hf). In the semiconductor device according to some example embodiments, the capacitor dielectric film 250 may have a stacked film structure of a ferroelectric material film and a paraelectric material film.

The ferroelectric material film may have ferroelectric properties. The ferroelectric material film may have a thickness to the extent that it has ferroelectric properties. A thickness range of the ferroelectric material film having the ferroelectric properties may vary depending on the ferroelectric material.

For example, the ferroelectric material film may include a monometal oxide. The ferroelectric material film may include a monometal oxide film. Here, the monometal oxide may be a binary compound made up of one metal and oxygen. The ferroelectric material film including the monometal oxide may have an orthorhombic crystal structure.

As an example, the metal included in the monometal oxide film may be hafnium (Hf). The monometal oxide film may be a hafnium oxide film (HfO). Here, the hafnium oxide film may have a chemical formula suitable for stoichiometry, and may have a chemical formula not suitable for stoichiometry.

Alternatively or additionally, the metal included in the monometal oxide film may be one or more of rare earth metals belonging to lanthanoids. The monometal oxide film may be a rare earth metal oxide film belonging to the lanthanoids. Here, the rare earth metal oxide film belonging to the lanthanoids may have a chemical formula suitable for stoichiometry, and may have a chemical formula not suitable for stoichiometry. When the ferroelectric material film includes a monometal oxide film, the ferroelectric material film may have a thickness of, for example, 1 nm or more and 10 nm or less.

For example, the ferroelectric material film may include a bimetal oxide. The ferroelectric material film may include a bimetal oxide film. Here, the bimetal oxide may be a ternary compound made up two metals and oxygen. The ferroelectric material film including the bimetal oxide may have an orthorhombic crystal structure.

The metal included in the bimetal oxide film may be, for example, hafnium (Hf) and zirconium (Zr). The bimetal oxide film may be a hafnium zirconium oxide film ($Hf_xZr_{(1-x)}O$). In the bimetal oxide film, x may be 0.2 or more and 0.8 or less. Here, the hafnium oxide zirconium film ($Hf_xZr_{(1-x)}O$) may have a formula suitable for stoichiometry, and may have a formula not suitable for stoichiometry.

When the ferroelectric material film includes a bimetal oxide film, the ferroelectric material film 132 may have a thickness of, for example, 1 nm or more and 20 nm or less.

For example, the dielectric material film may be a dielectric film including zirconium (Zr) or a stacked film including zirconium (Zr), but is not limited thereto. Even if the chemical formula is the same, the ferroelectric properties may be exhibited or the paraelectric properties may be exhibited depending on the crystal structure of the dielectric substance.

The paraelectric material has a positive dielectric constant, and the ferroelectric material may have a negative dielectric constant in a given interval. For example, paraelectric material may have a positive capacitance and the ferroelectric material may have a negative capacitance.

In general, when two or more capacitors having positive capacitance are connected in series, the sum of capacitance decreases. However, when a negative capacitor having a negative capacitance is connected to a positive capacitor having a positive capacitance in series, the sum of capacitance increases.

The upper electrode 240 may be formed on the capacitor dielectric film 250. The upper electrode 240 may include, for example, but not limited to, one or more of a doped semiconductor material, a conductive metal nitride (e.g., titanium nitride, tantalum nitride, niobium nitride or tungsten nitride, etc.), a metal (e.g., ruthenium, iridium, titanium, or tantalum, etc.), and a conductive metal oxide (e.g., iridium oxide or niobium oxide, etc.). Although the upper electrode 240 is shown as a single film, this is only for convenience of explanation, and the embodiment is not limited thereto.

The upper electrode 240 may extend from the uppermost surface 250_US of the capacitor dielectric film 250 toward the substrate 100 in the third direction D3, in the first capacitor block CB1, the second capacitor block CB2, the first edge capacitor block EB1, the second edge capacitor block EB2, and the separation block SB.

For example, in the first capacitor block CB1, the upper electrode 240 may extend from the uppermost surface 250_US of the capacitor dielectric film 250 toward the substrate 100 between the plurality of first lower electrodes 211 and on the capacitor dielectric film 250. In the second capacitor block CB2, the upper electrode 240 may extend from the uppermost surface 250_US of the capacitor dielectric film 250 toward the substrate 100 between the plurality of second lower electrodes 212 and on the capacitor dielectric film 250.

In the first edge capacitor block EB1, the upper electrode 240 may extend from the uppermost surface 250_US of the capacitor dielectric film 250 toward the substrate 100 between the plurality of first edge electrodes 221 and on the capacitor dielectric film 250. In the second edge capacitor block EB2, the upper electrode 240 may extend from the uppermost surface 250_US of the capacitor dielectric film 250 toward the substrate 100 between the plurality of second edge electrodes 222 and on the capacitor dielectric film 250.

In the separation block SB, the upper electrode 240 may extend from the uppermost surface 250_US of the capacitor dielectric film 250 toward the substrate 100 between the plurality of dummy lower electrodes 230 and on the capacitor dielectric film 250.

The semiconductor device according to some example embodiments may further include an etching stop film 260. The etching stop film 260 may be placed on the first conductive plate 110, the second conductive plate 120, and the separation insulating film 101 that is between the plurality of lower electrodes 270. The etching stop film 160 may include at least one of a silicon nitride film, a silicon carbonitride film, a silicon boronitride film (SiBN), a silicon oxynitride film, and a silicon oxycarbide film.

FIGS. 7 to 14 are intermediate step diagrams for explaining a method for fabricating the semiconductor device of FIG. 4.

Figure 7:
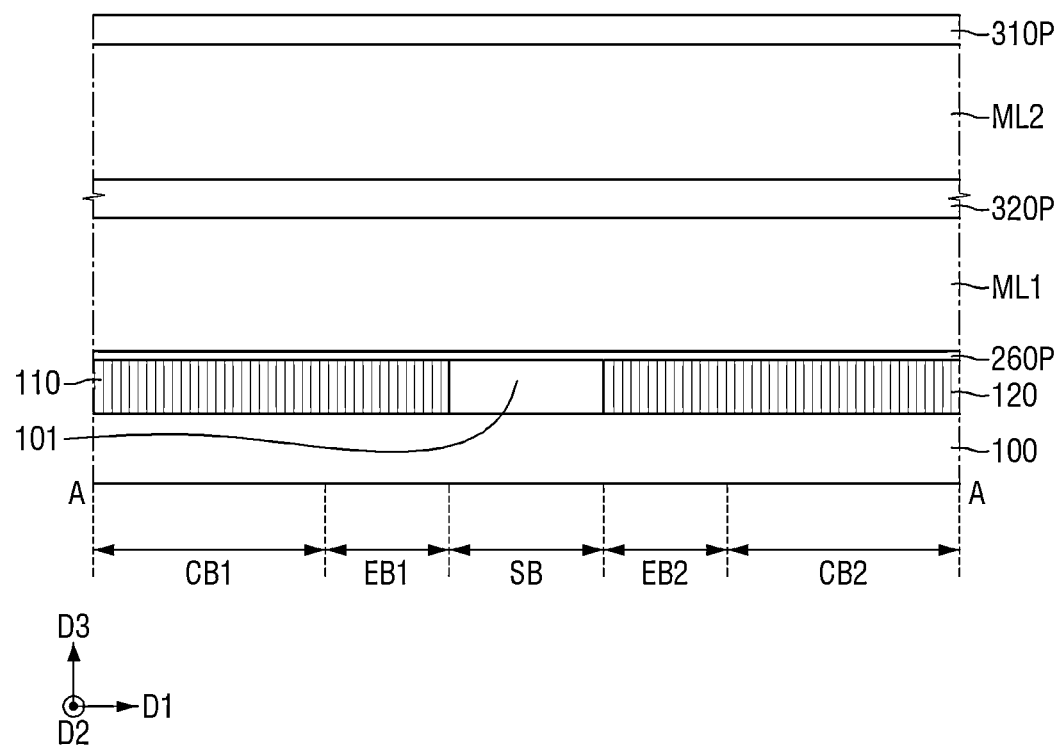
FIGS. 7 to 14 are intermediate step diagrams for explaining a method for fabricating the semiconductor device of FIG. 4.

Referring to FIG. 7, the first conductive plate 110, the separation insulating film 101, and the second conductive plate 120 are formed on the substrate 100. The first conductive plate 110, the separation insulating film 101, and the second conductive plate 120 may be formed with a deposition process, such as but not limited to one or more of a chemical vapor deposition (CVD) process or a sputter deposition process or an atomic layer deposition (ALD) process; however, example embodiments are not limited thereto.

A pre-etching stop film 260P, a first mold layer ML1, a second pre-support layer 320P, a second mold layer ML2, a first pre-support layer 310P are sequentially formed on the first conductive plate 110, the separation insulating film 101, and the second conductive plate 120.

Figure 8:
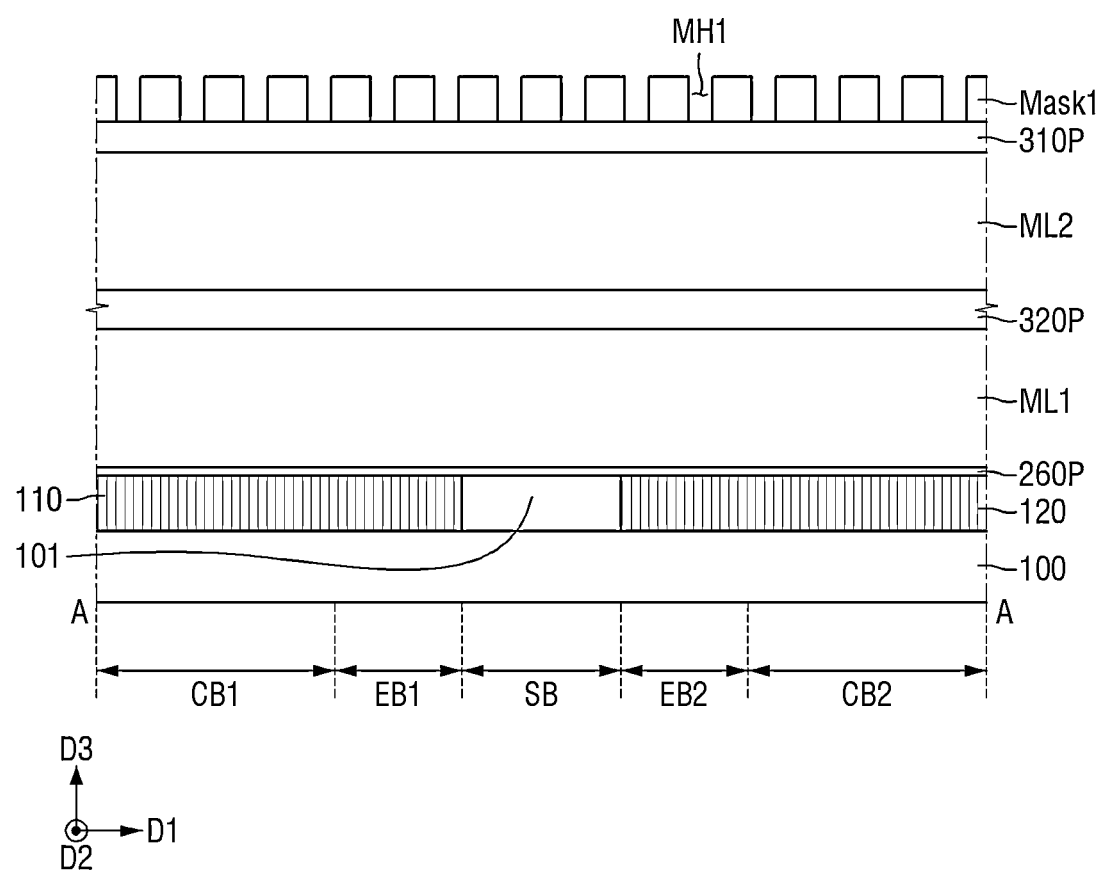

Referring to FIG. 8, a first mask pattern Mask1 is formed on the first pre-support layer 310P. The first mask pattern Mask1 includes a first mask hole MH1. The first mask hole MH1 is formed in the separation insulating film 101, the first conductive plate 110, and the second conductive plate 120 at equal intervals. The first mask hole MH1 exposes a part of the first pre-support layer 310P.

Figure 9:
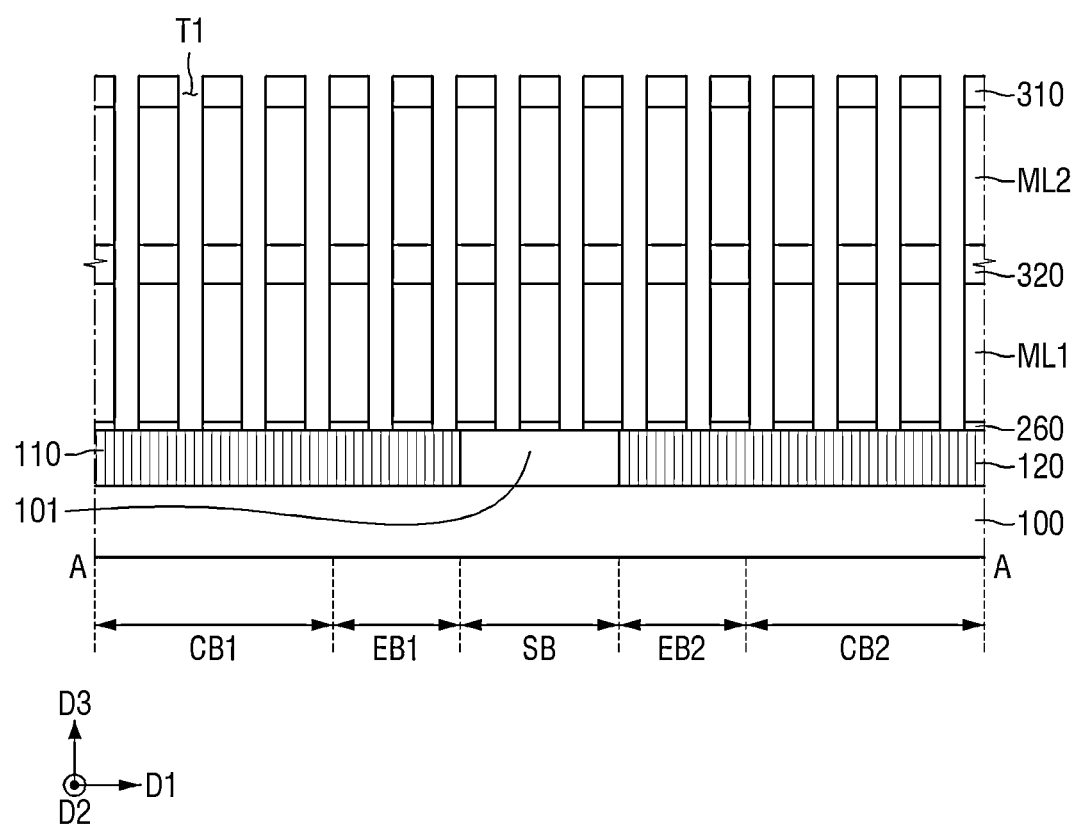

Referring to FIG. 9, the etching stop film 260, the first mold layer ML1, the second electrode support 320, the second mold layer ML2, and the first electrode support 310 are formed by performing patterning along the first mask hole MH1. A first trench T1 is formed between the stacked body of the etching stop film 260, the first mold layer ML1, the second electrode support 320, the second mold layer ML2, and the first electrode support 310.

Figure 10:
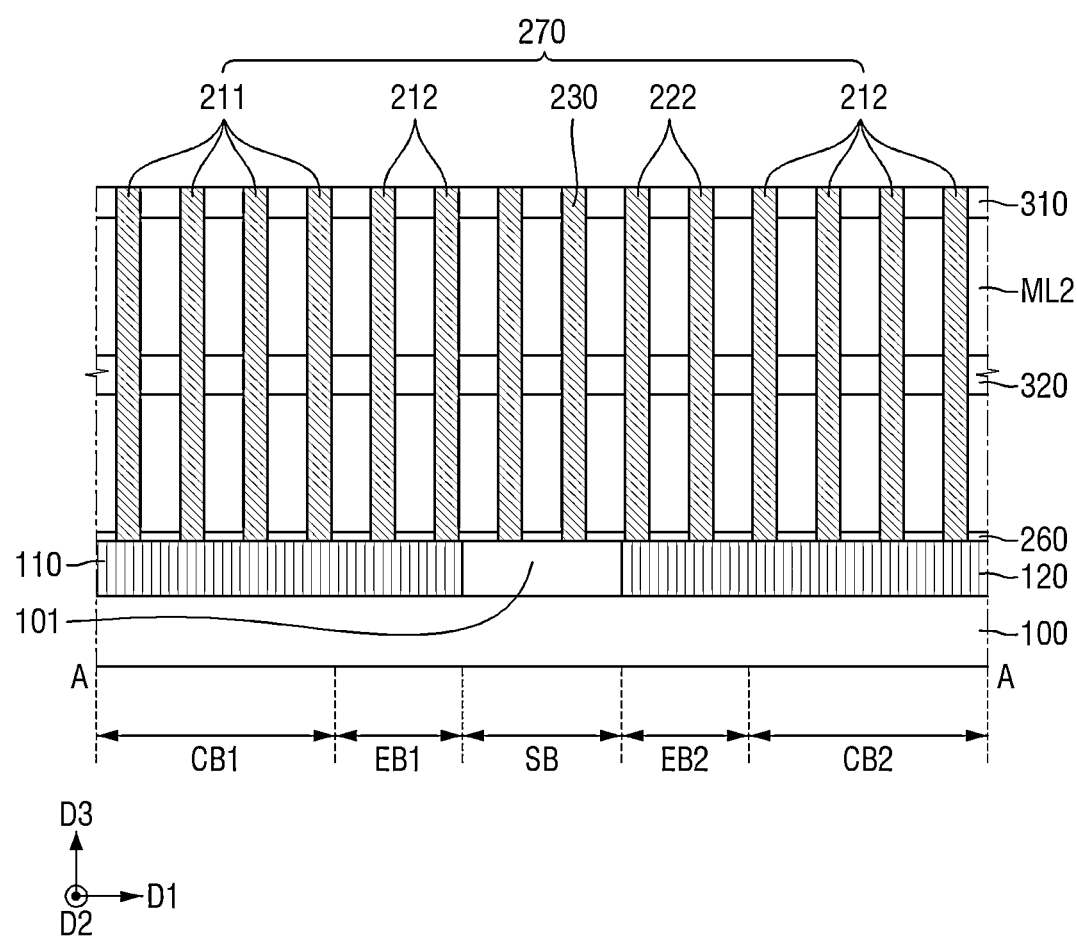

Referring to FIG. 10, a plurality of lower electrodes 270 are formed inside the first trench T1. A plurality of dummy lower electrodes 230 are formed on the separation insulating film 101.

Figure 11:
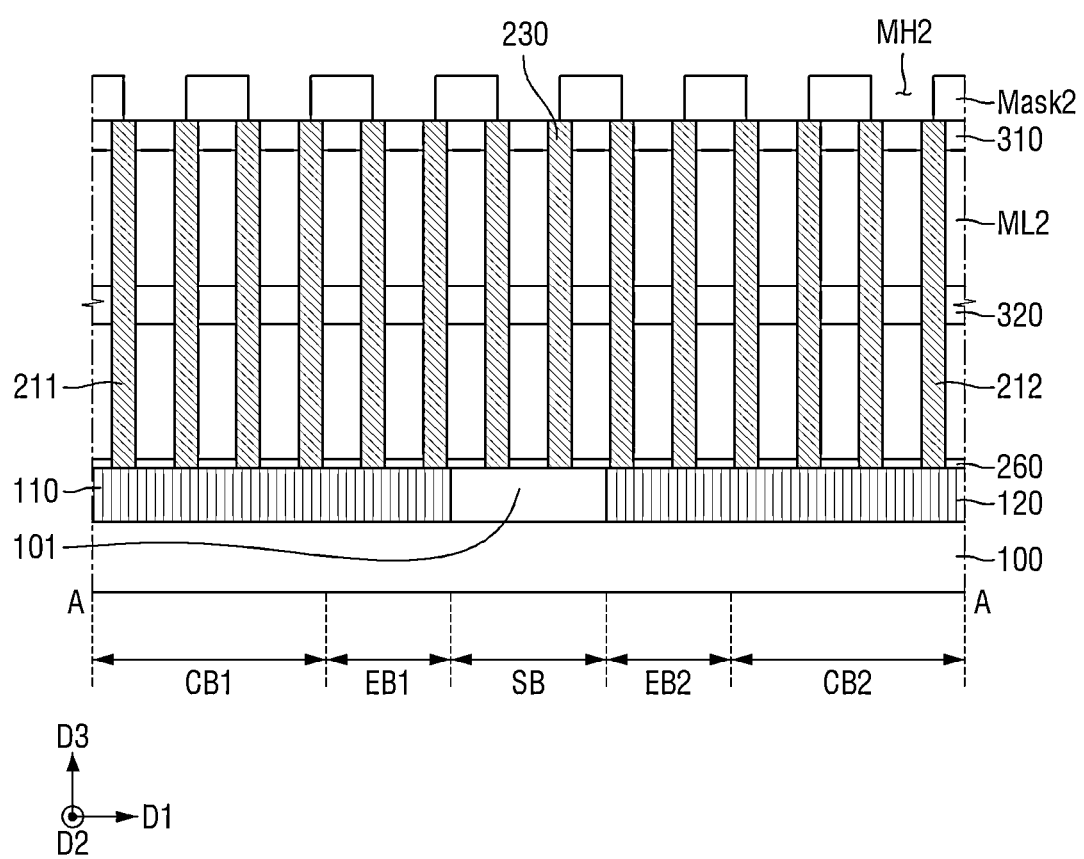

Referring to FIG. 11, a second mask pattern Mask2 is formed on the first electrode support 130 and the plurality of lower electrodes 270.

The second mask pattern Mask2 includes or defines a second mask hole MH2. The second mask pattern Mask2 may partially overlap the plurality of lower electrodes 270. The second mask hole MH2 may expose a part of the first electrode support 310. The second mask hole MH2 may correspond to the above-mentioned penetration pattern OP.

Figure 12:
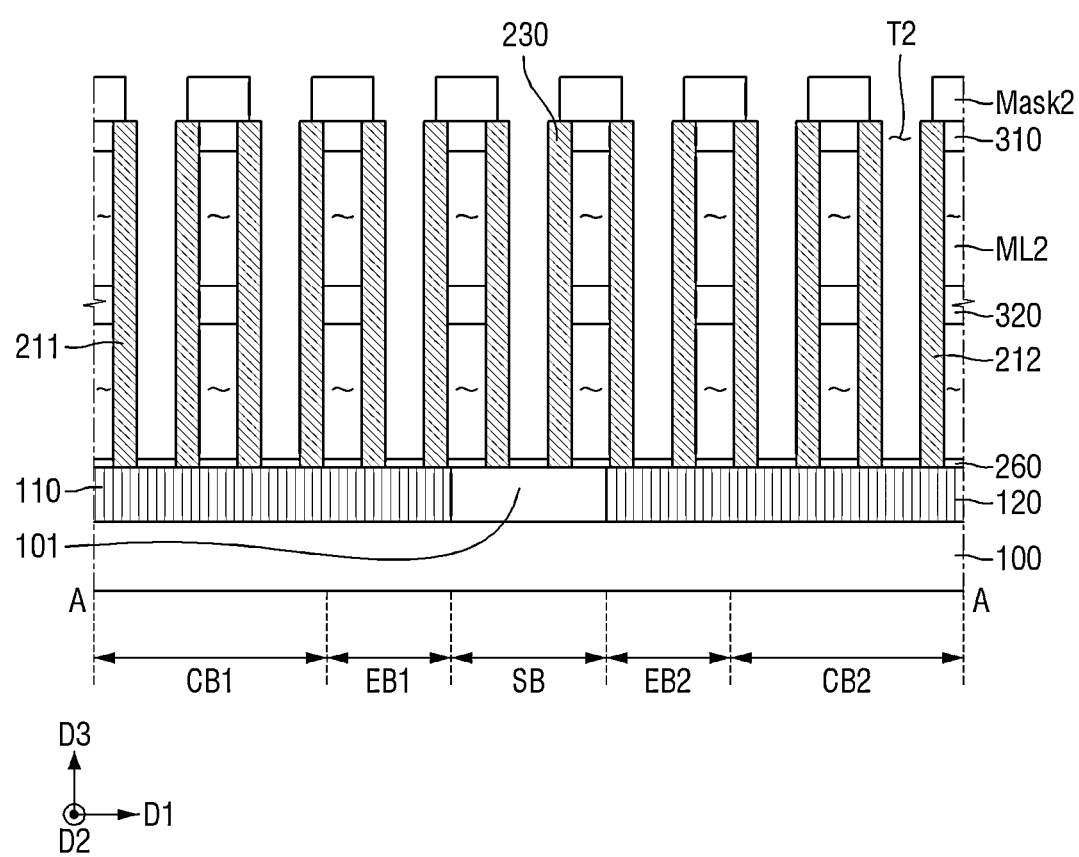

Referring to FIG. 12, the first electrode support 310 exposed by the second mask hole MH2 is removed. That is, the first electrode support 310 that overlaps the second mask hole MH2 is removed to form a second trench T2.

Further, the first mold layer ML1 and the second mold layer ML2 are removed. Accordingly, an empty space is formed between the plurality of lower electrodes 270, the first electrode support 310, and the second electrode support 320. Similarly, an empty space is formed between the plurality of lower electrodes 270, the second electrode support 320, and the etching stop film 260.

Figure 13:
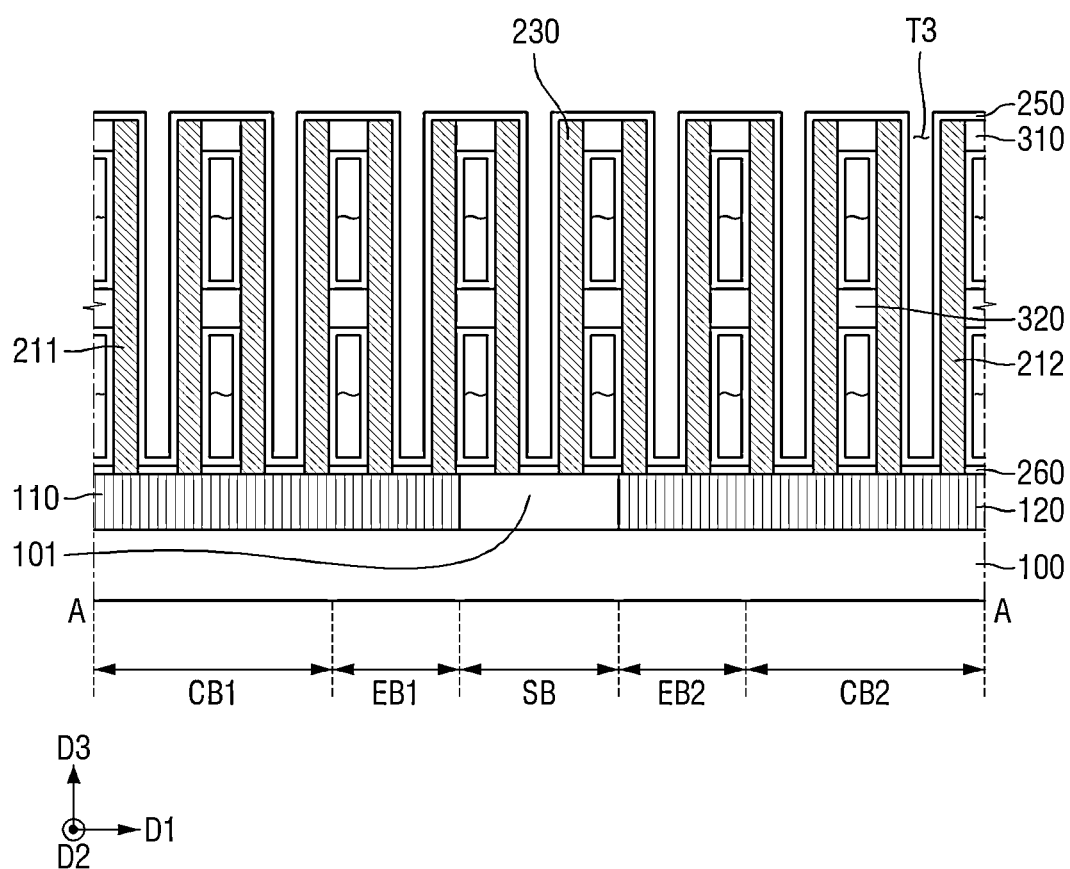

Referring to FIG. 13, a capacitor dielectric film 250 is formed along profiles of the plurality of lower electrodes 270 on the etching stop film 260, the upper and lower surfaces of the first electrode support 310, and the upper and lower surfaces of the second electrode support 320. The capacitor dielectric film 250 is formed in the second trench T2, and a third trench T3 is formed. The capacitor dielectric film 250 may be conformally formed or deposited.

Figure 14:
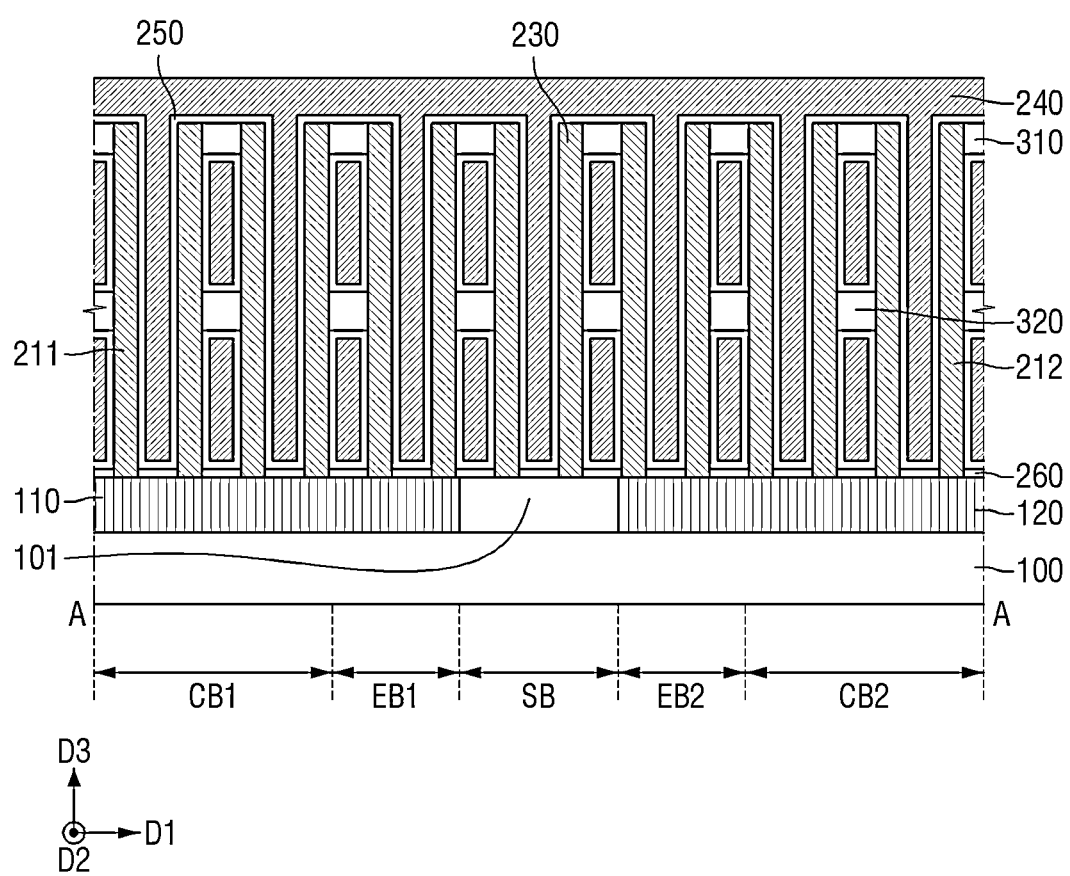

Referring to FIG. 14, the upper electrode 240 is formed on the capacitor dielectric film 250.

The upper electrode 240 is formed inside the third trench T3. The upper electrode 240 may extend toward the substrate 100 in the space in which the first electrode support 310 is removed by the mask hole MH of FIG. 11. An upper surface of the upper electrode 240 may be planarized, e.g., with a chemical mechanical planarization (CMP) process and/or an etch-back process; however, example embodiments are not limited thereto.

Figure 15:
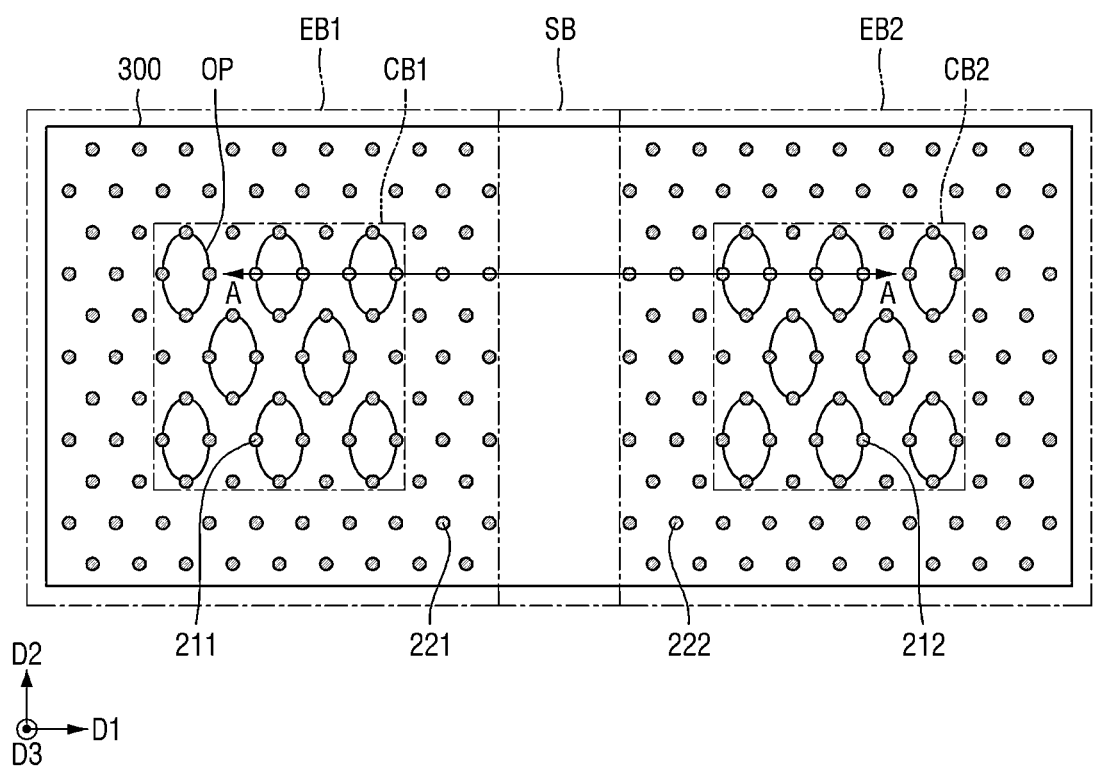
FIG. 15 is an example plan view for explaining a capacitor structure according to some other embodiments of inventive concepts.
Figure 16:
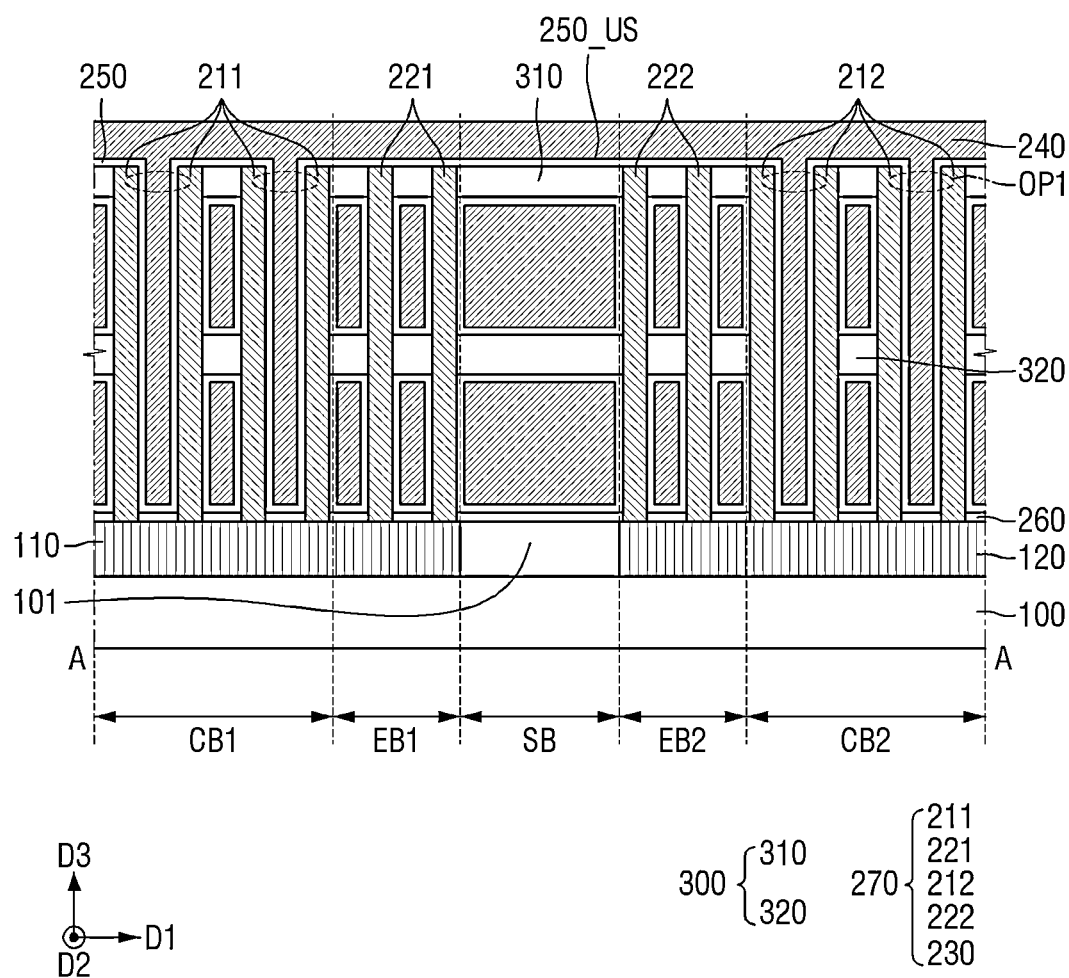
FIG. 16 is an example cross-sectional view taken along A-A of FIG. 15.

FIG. 15 is an example plan view for explaining a capacitor structure according to some example embodiments of inventive concepts. FIG. 16 is an example cross-sectional view taken along A-A of FIG. 15. For convenience of explanation, points different from those described referring to FIGS. 3 to 6 will be mainly described.

Referring to FIG. 15, the separation block SB does not include a dummy lower electrode (230 of FIG. 3). The first edge capacitor block EB1 and the second edge capacitor block EB2 do not include the penetration pattern OP. For example, the penetration pattern OP is not formed or arranged in the first edge capacitor block EB1 and the second edge capacitor block EB2.

Referring to FIG. 16, the etching stop film 260, the upper electrode 240, the first electrode support 310, and the second electrode support 320 are placed on the separation insulating film 101 in the separation block SB region.

The penetration pattern OP is formed in the first capacitor block CB1 and the second capacitor block CB2. On the other hand, the penetration pattern OP is not formed in the first edge capacitor block EB1 and the second edge capacitor block EB2.

In the first capacitor block CB1, the upper electrode 240 may extend from the uppermost surface 250_US of the capacitor dielectric film 250 toward the substrate 100 between the plurality of first lower electrodes 211 and on the capacitor dielectric film 250. On the other hand, in the first edge capacitor block EB1, the upper electrode 240 does not extend from the uppermost surface 250_US of the capacitor dielectric film 250 toward the substrate 100 between the plurality of first edge electrodes 221 and on the capacitor dielectric film 250.

In the second capacitor block CB2, the upper electrode 240 may extend from the uppermost surface 250_US of the capacitor dielectric film 250 toward the substrate 100 between the plurality of second lower electrodes 212 and on the capacitor dielectric film 250. On the other hand, in the second edge capacitor block EB2, the upper electrode 240 does not extend from the uppermost surface 250_US of the capacitor dielectric film 250 toward the substrate 100 between the plurality of second edge electrodes 222 and on the capacitor dielectric film 250.

FIGS. 17 to 21 are intermediate step diagrams for explaining a method for fabricating the semiconductor device of FIG. 15. For convenience of explanation, points different from those described referring to FIGS. 7 to 14 will be mainly described.

Figure 17:
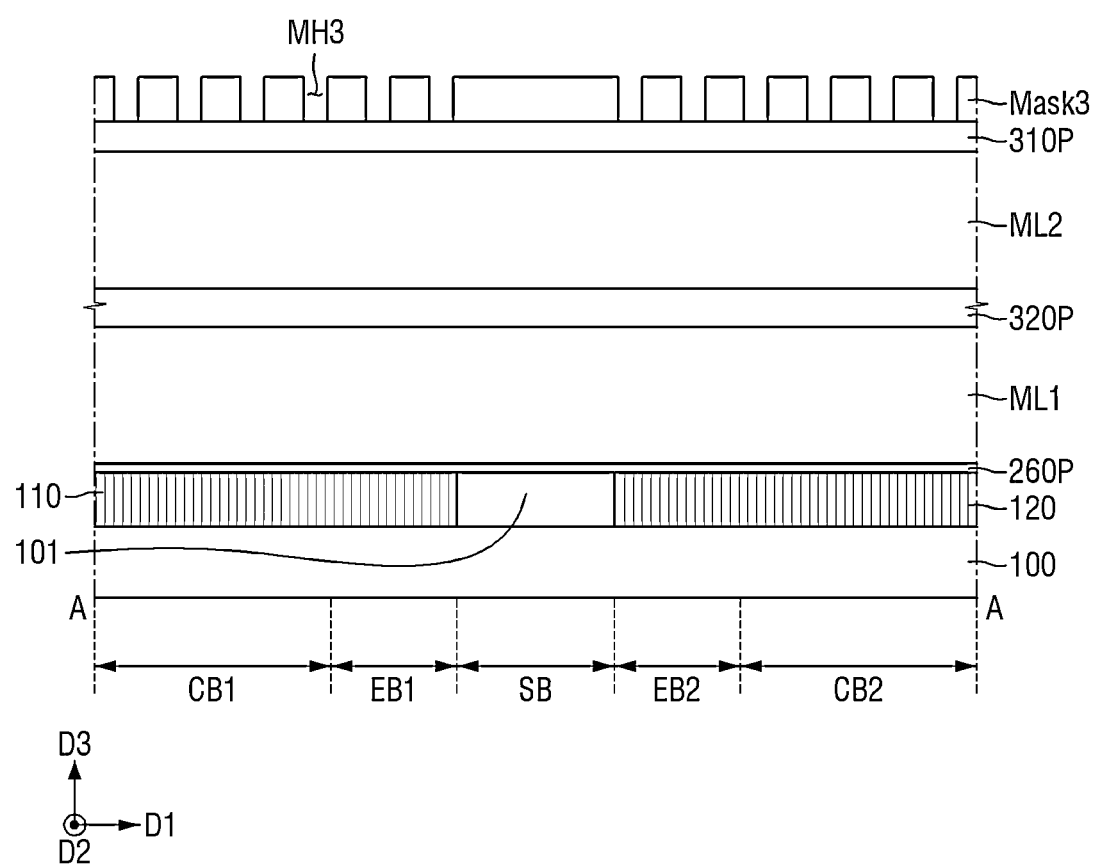
FIGS. 17 to 21 are intermediate step diagrams for explaining the method for fabricating the semiconductor device of FIG. 15.

Referring to FIG. 17, the first pre-support layer 310P is sequentially formed. A third mask pattern Mask3 is formed. The third mask pattern Mask3 includes or defines a third mask hole MH3. The third mask hole MH3 exposes a part of the first pre-support layer 310P. The third mask hole MH3 is formed on the first conductive plate 110 and the second conductive plate 120. The third mask hole MH3 is not formed on the separation insulating film 101.

Figure 18:
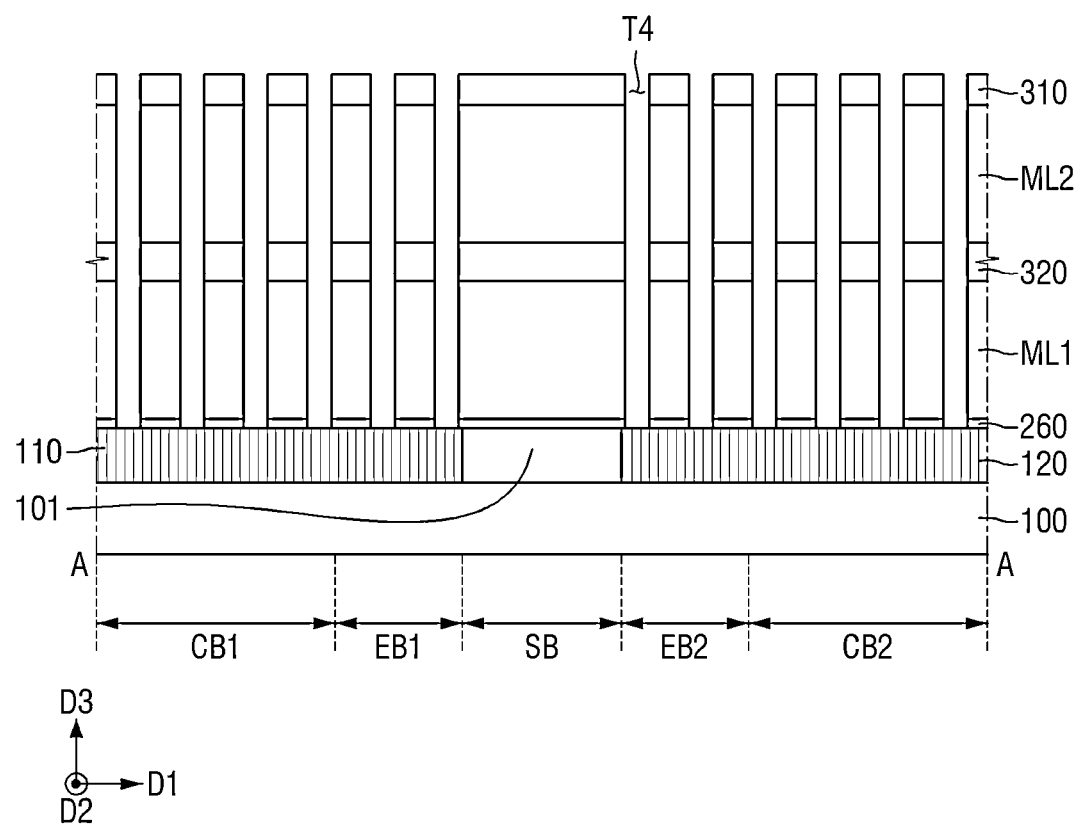

Referring to FIG. 18, patterning is performed along the third mask hole MH3 to form the etching stop film 260, the first mold layer ML1, the second electrode support 320, the second mold layer ML2, and the first electrode support 310. A fourth trench T4 is formed between the stacked body of the etching stop film 260, the first mold layer ML1, the second electrode support 320, the second mold layer ML2, and the first electrode support 310.

Since the third mask hole MH3 is not formed on the separation insulating film 101, the fourth trench T4 is not formed on the separation insulating film 101.

Figure 19:
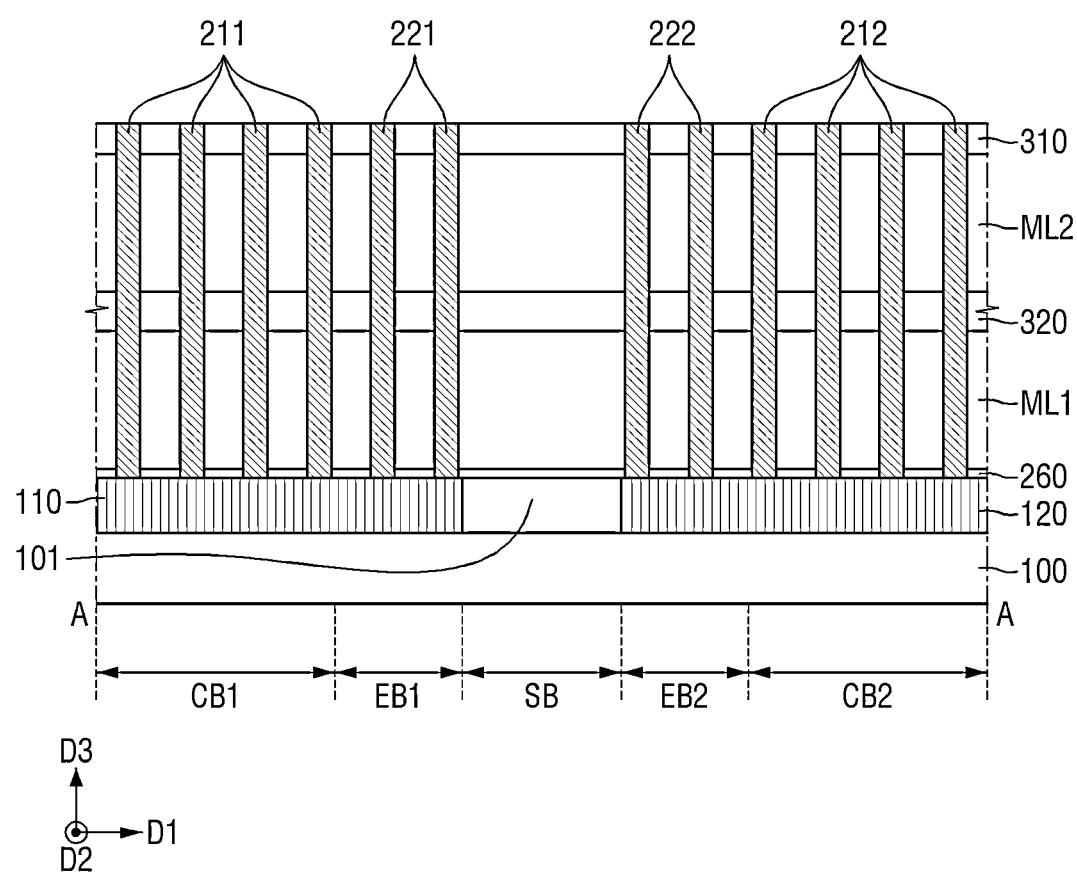

Referring to FIG. 19, a plurality of lower electrodes 270 are formed inside the fourth trench T4. The lower electrode is not formed on the separation insulating film 101.

Figure 20:
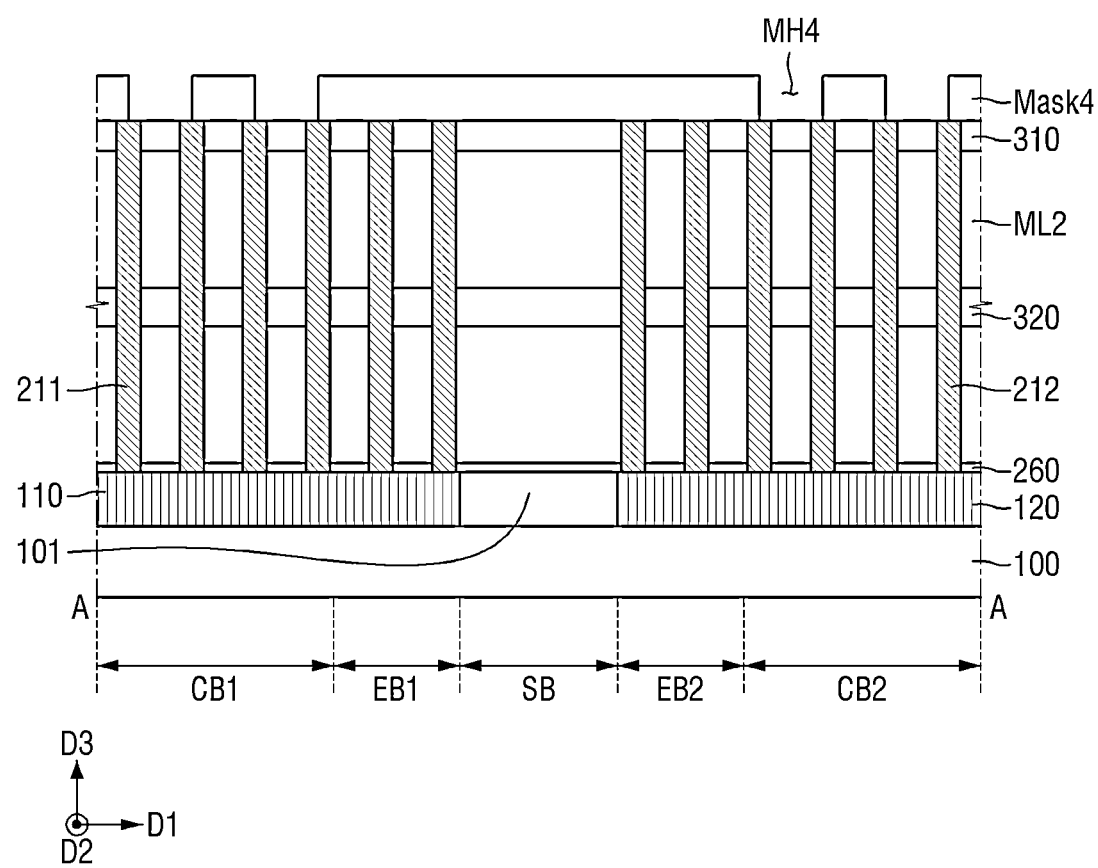

Referring to FIG. 20, a fourth mask pattern Mask 4 is formed on the first electrode support 130 and the plurality of lower electrodes 270. The fourth mask pattern Mask4 includes or defines a fourth mask hole MH4.

The fourth mask hole MH4 is formed only in the regions of the first capacitor block CB1 and the second capacitor block CB2. The fourth mask hole MH4 is not formed in the regions of the first edge capacitor block EB1, the second edge capacitor block EB2, and the separation block SB.

The fourth mask hole MH4 may expose a part of the first electrode support 310. Specifically, a part of the first electrode support 310 in the regions of the first capacitor block CB1 and the second capacitor block CB2 is exposed.

Figure 21:
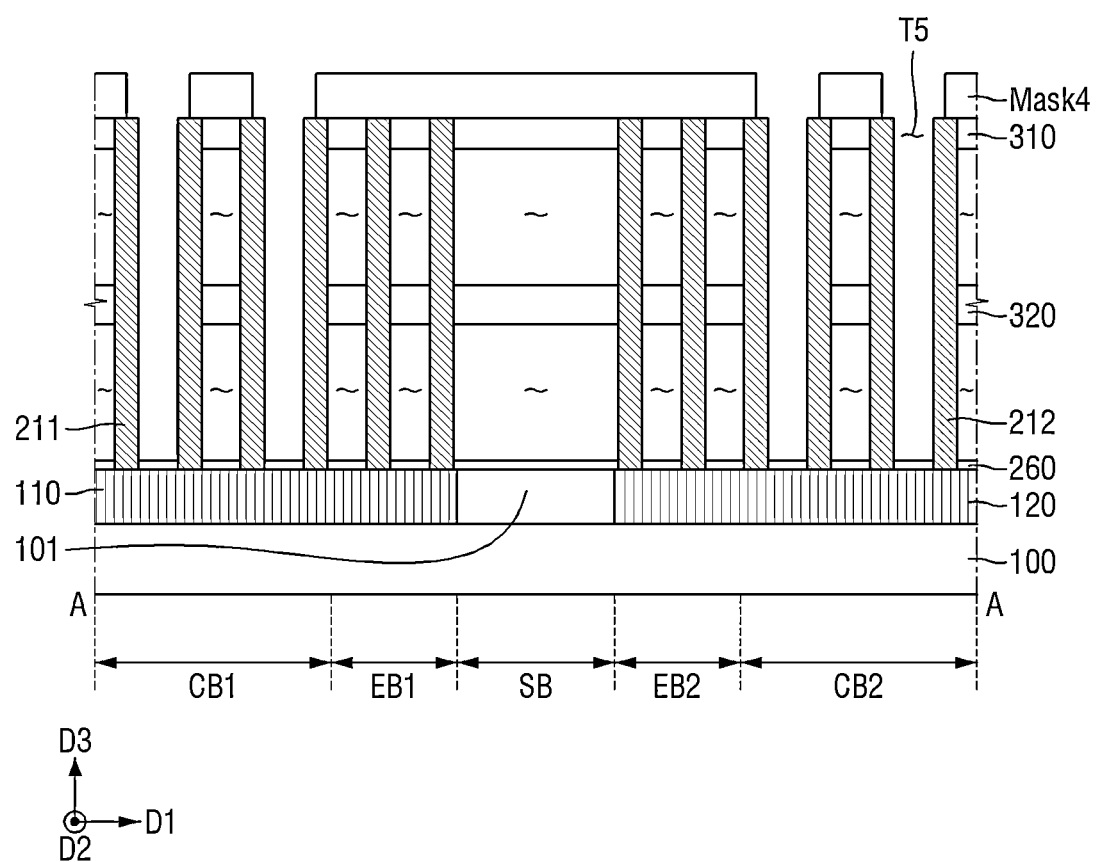

Referring to FIG. 21, the first electrode support 310 exposed by the fourth mask hole MH4 is removed. The first electrode support 310 is removed to form a fifth trench T5.

The fifth trench T5 is formed only in the regions of the first capacitor block CB1 and the second capacitor block CB2.

Further, the first mold layer ML1 and the second mold layer ML2 are removed. Accordingly, an empty space is formed between the plurality of lower electrodes 270, the first electrode support 310, and the second electrode support 320. Similarly, an empty space is formed between the plurality of lower electrodes 270, the second electrode support 320, and the etching stop film 260.

Next, as described referring to FIGS. 13 and 14, the capacitor dielectric film 250 and the upper electrode 240 are sequentially formed.

Since the fifth trench T5 is formed only in the regions of the first capacitor block CB1 and the second capacitor block CB2, the upper electrode 240 extending from the uppermost surface of the capacitor dielectric film 250 toward the substrate 100 is also formed only in the regions of the first capacitor block CB1 and the second capacitor block CB2.

Figure 22:
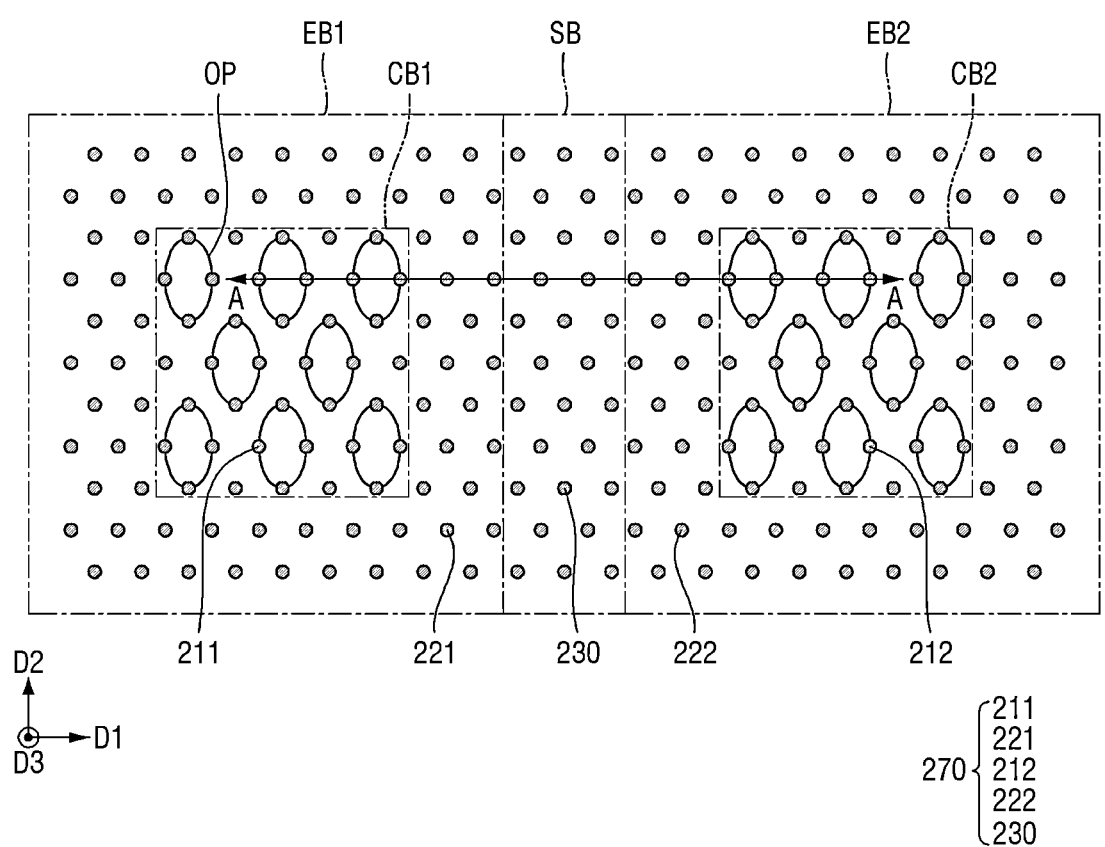
FIG. 22 is an example plan view for explaining a capacitor structure according to some other embodiment of inventive concepts.

FIG. 22 is an example plan view for explaining a capacitor structure according to some example embodiments of inventive concepts. FIG. 23 is an example cross-sectional view taken along A-A of FIG. 22. For convenience of explanation, points different from those described referring to FIGS. 3, 4, 15 and 16 will be mainly described.

Referring to FIG. 22, the separation block SB may include a plurality of dummy lower electrodes 230. The penetration pattern OP is not formed in the separation block SB, the first edge capacitor block EB1, and the second edge capacitor block EB2.

Referring to FIG. 23, a plurality of dummy lower electrodes 230 are placed on the separation insulating film 101 in the separation block SB region.

The penetration pattern OP is formed in the first capacitor block CB1 and the second capacitor block CB2. On the other hand, the penetration pattern OP is not formed in the separation block SB, the first edge capacitor block EB1, and the second edge capacitor block EB2.

In the first capacitor block CB1, the upper electrode 240 may extend from the uppermost surface 250_US of the capacitor dielectric film 250 toward the substrate 100 between the plurality of first lower electrodes 211 and on the capacitor dielectric film 250. In the second capacitor block CB2, the upper electrode 240 may extend from the uppermost surface 250_US of the capacitor dielectric film 250 toward the substrate 100 between the plurality of second lower electrodes 212 and on the capacitor dielectric film 250.

On the other hand, in the separation block SB, the upper electrode 240 does not extend from the uppermost surface 250_US of the capacitor dielectric film 250 toward the substrate 100 between the plurality of dummy electrodes 230 and on the capacitor dielectric film 250.

In the first edge capacitor block EB1, the upper electrode 240 does not extend from the uppermost surface 250_US of the capacitor dielectric film 250 toward the substrate 100 between the plurality of first edge electrodes 221 and on the capacitor dielectric film 250. In the second edge capacitor block EB2, the upper electrode 240 does not extend from the uppermost surface 250_US of the capacitor dielectric film 250 toward the substrate 100 between the plurality of second edge electrodes 222 and on the capacitor dielectric film 250.

Figure 24:
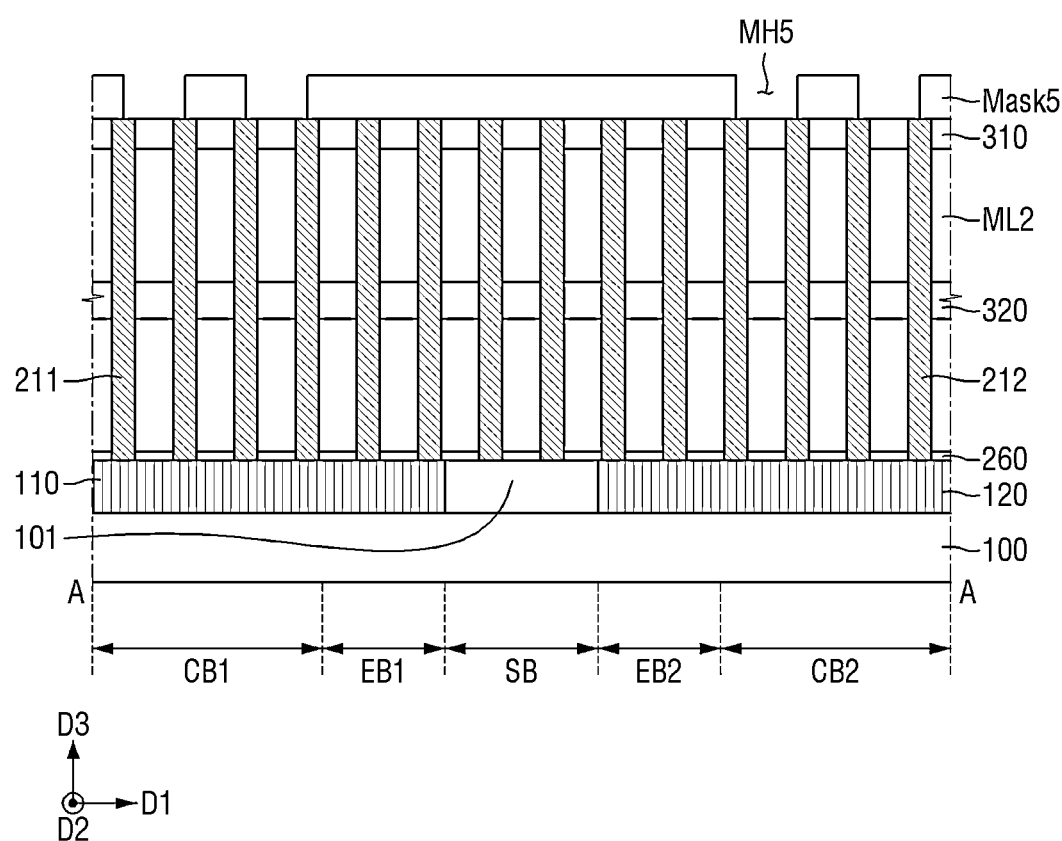
FIGS. 24 and 25 are intermediate step diagrams for explaining the method for fabricating the semiconductor device of FIG. 23.
Figure 25:
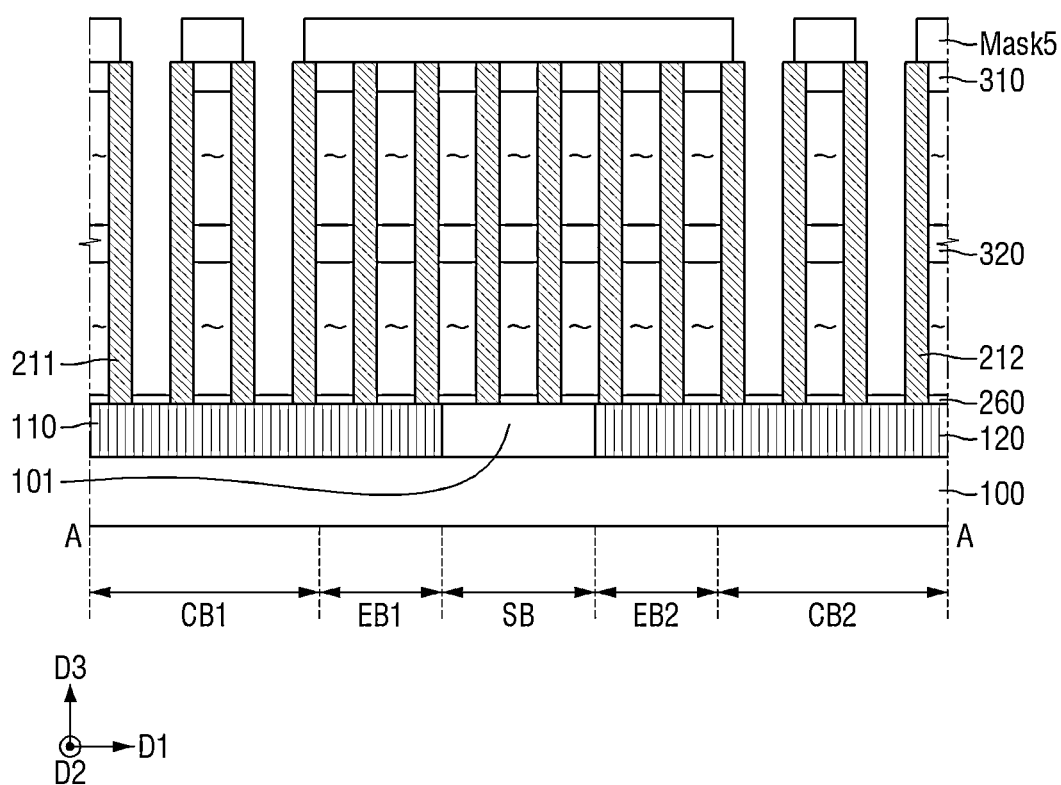

FIGS. 24 and 25 are intermediate step diagrams for explaining the method for fabricating the semiconductor device of FIG. 23. For convenience of explanation, points different from those described referring to FIGS. 7 to 14 and 17 to 21 will be mainly described.

Referring to FIG. 24, as in FIG. 10, a fifth mask pattern Mask 5 including or defining a fifth mask hole MH5 is formed on the plurality of lower electrodes 270 and the first electrode support 310 in a state in which the plurality of lower electrodes 270 are formed.

The fifth mask hole MH5 is formed only in the regions of the first capacitor block CB1 and the second capacitor block CB2. The fifth mask hole MH5 is not formed in the regions of the first edge capacitor block EB1, the second edge capacitor block EB2, and the separation block SB.

Referring to FIG. 25, the first electrode support 310 exposed by the fifth mask hole MH5 is removed. The first electrode support 310 is removed to form a sixth trench T6. The sixth trench T6 is formed only in the regions of the first capacitor block CB1 and the second capacitor block CB2. Further, the first mold layer ML1 and the second mold layer ML2 are removed. Accordingly, an empty space is formed between the plurality of lower electrodes 270, the first electrode support 310, and the second electrode support 320. Similarly, an empty space is formed between the plurality of lower electrodes 270, the second electrode support 320, and the etching stop film 260.

Next, as described referring to FIGS. 13 and 14, the capacitor dielectric film 250 and the upper electrode 240 are sequentially formed.

Since the sixth trench T6 is formed only in the regions of the first capacitor block CB1 and the second capacitor block CB2, the upper electrode 240 extending from the uppermost surface of the capacitor dielectric film 250 toward the substrate 100 is also formed only in the regions of the first capacitor block CB1 and the second capacitor block CB2.

Accordingly, a plurality of dummy lower electrodes 230 are formed on the separation insulating film 101 of the separation block SB. On the other hand, unlike FIG. 12, since the sixth trench T6 is not formed in the separation block SB, the upper electrode 240 extending from the uppermost surface of the capacitor dielectric film 250 toward the substrate 100 between the plurality of dummy lower electrodes 230 of the separation block SB is not formed on the separation block SB.

Figure 26:
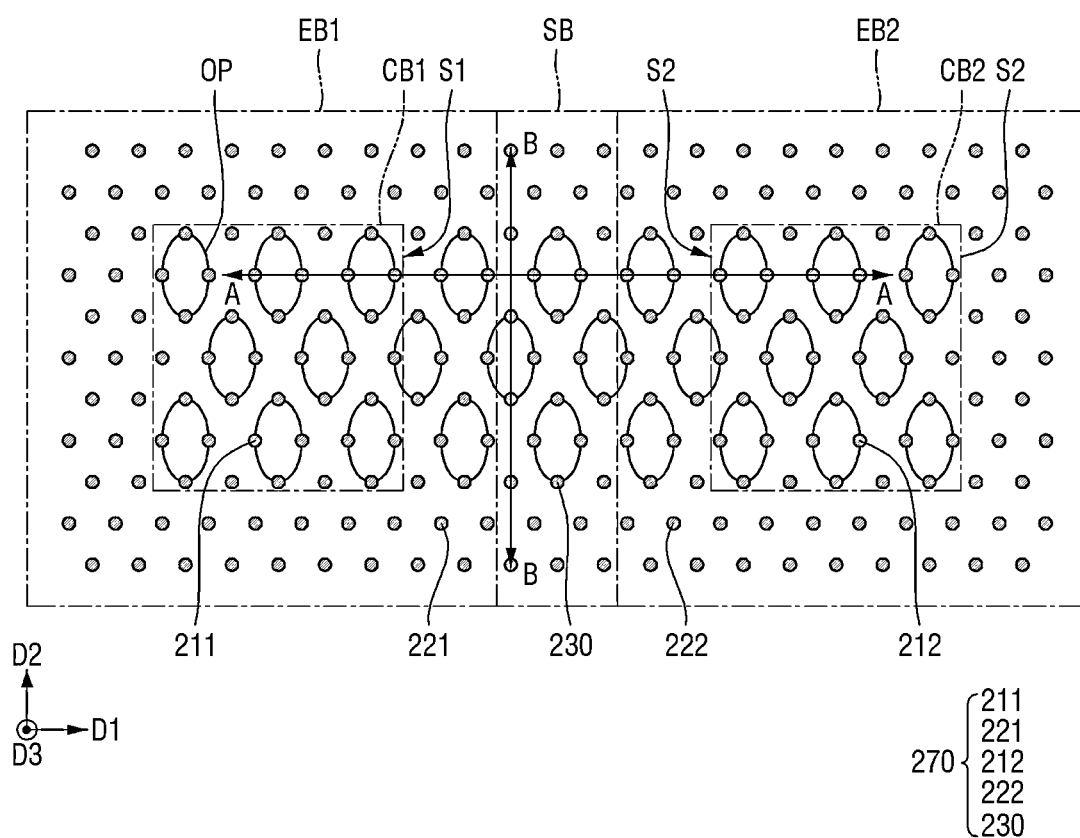
FIG. 26 is an example plan view for explaining the capacitor structure according to some other embodiment of inventive concepts.
Figure 27:
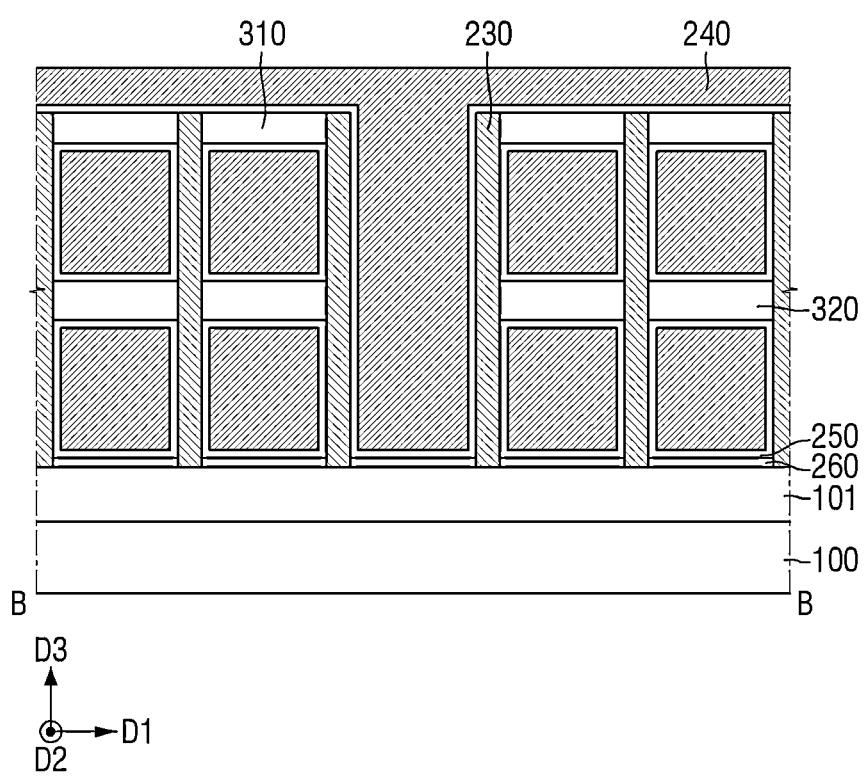
FIG. 27 is an example cross-sectional view taken along B-B of FIG. 26.

FIG. 26 is an example plan view for explaining the capacitor structure according to some other embodiment of inventive concepts. FIG. 27 is an example cross-sectional view taken along B-B of FIG. 26. For convenience of explanation, points different from those described referring to FIGS. 3 to 6, 22 and 23 will be mainly described.

Referring to FIG. 26, the separation block SB may include a plurality of dummy lower electrodes 230. The separation block SB may include a penetration pattern OP. The first edge capacitor block EB1 and the second edge capacitor block EB2 may include the penetration pattern OP.

Specifically, a part of the first edge capacitor block EB1, the separation block SB and the second edge capacitor block EB2 that overlap the first capacitor block CB1 and the second capacitor block CB2 in the first direction D1 may include the penetration pattern OP.

The first capacitor block CB1 may include a first surface S1 facing the separation block SB. The second capacitor block CB2 may include a second surface S2 facing the separation block SB.

The penetration pattern OP may be formed in a partial region of the first edge capacitor block EB1 between the first surface S1 and the second surface S2. For example, the penetration pattern OP may be formed in a partial region of the first edge capacitor block EB1 between the first surface S1 of the first capacitor block CB1 and the separation block SB.

The penetration pattern OP may be formed over a plurality of first edge electrodes 221 in a partial region of the first edge capacitor block EB1 that overlaps the first surface S1 and the second surface S2 in the first direction D1.

The penetration pattern OP is not formed in the region of the first edge capacitor block EB1 that surrounds the surfaces other than the first surface S1 of the first capacitor block CB1. That is, the penetration pattern OP is not formed in a region of a "U"-shaped first edge capacitor block EB1 that partially surrounds the first capacitor block CB1.

The penetration pattern OP may be formed in a partial region of the second edge capacitor block EB2 between the first surface S1 and the second surface S2. For example, the penetration pattern OP may be formed in a partial region of the second edge capacitor block EB2 between the second surface S2 of the second capacitor block CB2 and the separation block SB.

The penetration pattern OP may be formed over a plurality of second edge electrodes 222 in a partial region of the second edge capacitor block EB2 that overlaps the first surface S1 and the second surface S2 in the first direction D1.

The penetration pattern OP is not formed in the region of the second edge capacitor block EB2 which surrounds the other surfaces except the second surface S2 of the second capacitor block CB2. That is, the penetration pattern OP is not formed in the region of the left-right inverted "U"-shaped second edge capacitor block EB2 that partially surrounds the second capacitor block CB2.

The penetration pattern OP may be formed in a partial region of the separation block SB between the first surface S1 and the second surface S2. The penetration pattern OP may be formed over a plurality of dummy lower electrodes 230 in a partial region of the separation block SB that overlaps the first surface S1 and the second surface S2 in the first direction D1.

The cross-section taken along A-A of FIG. 26 is the same as the cross-section described referring to FIG. 4.

Referring to FIG. 27 as compared with FIG. 6, since the penetration pattern OP is formed in a part of the separation block SB and the penetration pattern OP is not formed in the remaining part, a region in which the first electrode support 310 is formed on the separation insulating film 101 is large.

In a partial region of the separation block SB in which the penetration pattern OP is not formed, the upper electrode 240 does not extend from the uppermost surface of the capacitor dielectric film 250 toward the substrate 100.

Figure 28:
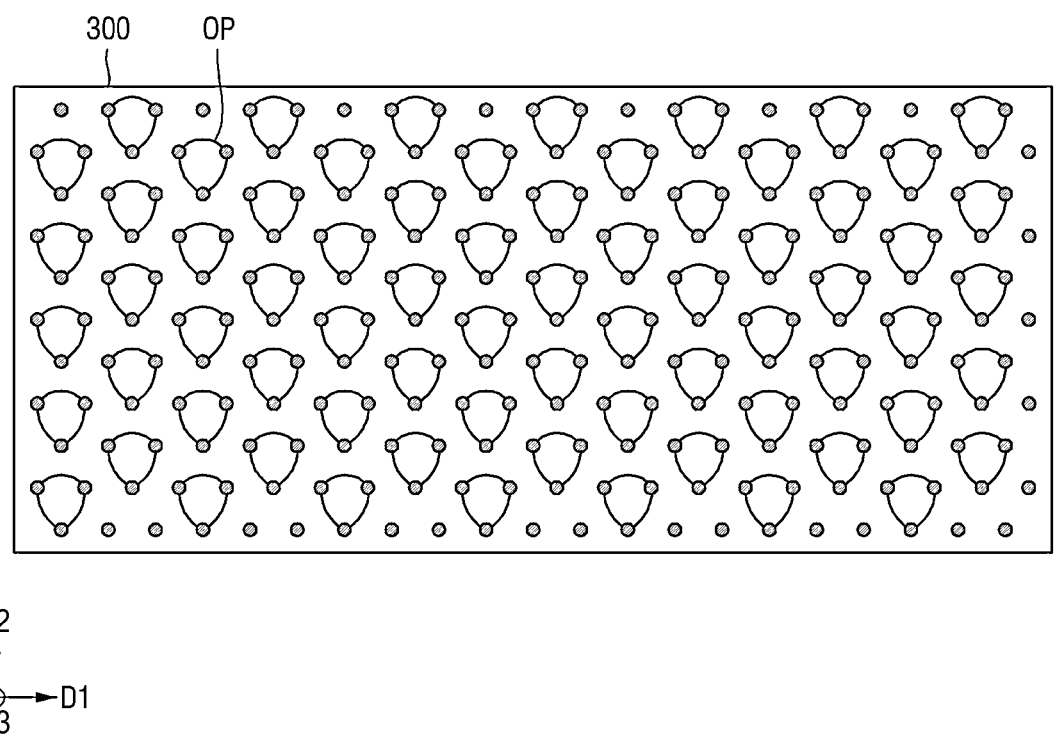
FIG. 28 is a diagram for explaining the electrode support according to some other embodiment of inventive concepts.

FIG. 28 is a diagram for explaining the electrode support according to some other embodiment of inventive concepts. For convenience of explanation, points different from those described referring to FIG. 3 will be mainly described.

Referring to FIG. 28, the support structure 300 may include penetration pattern OP of other shapes. The penetration pattern OP may be formed over the three lower electrodes. However, example embodiments are not limited thereto, and the shape of the penetration pattern OP may be variously formed depending on various example embodiments.

Figure 29:
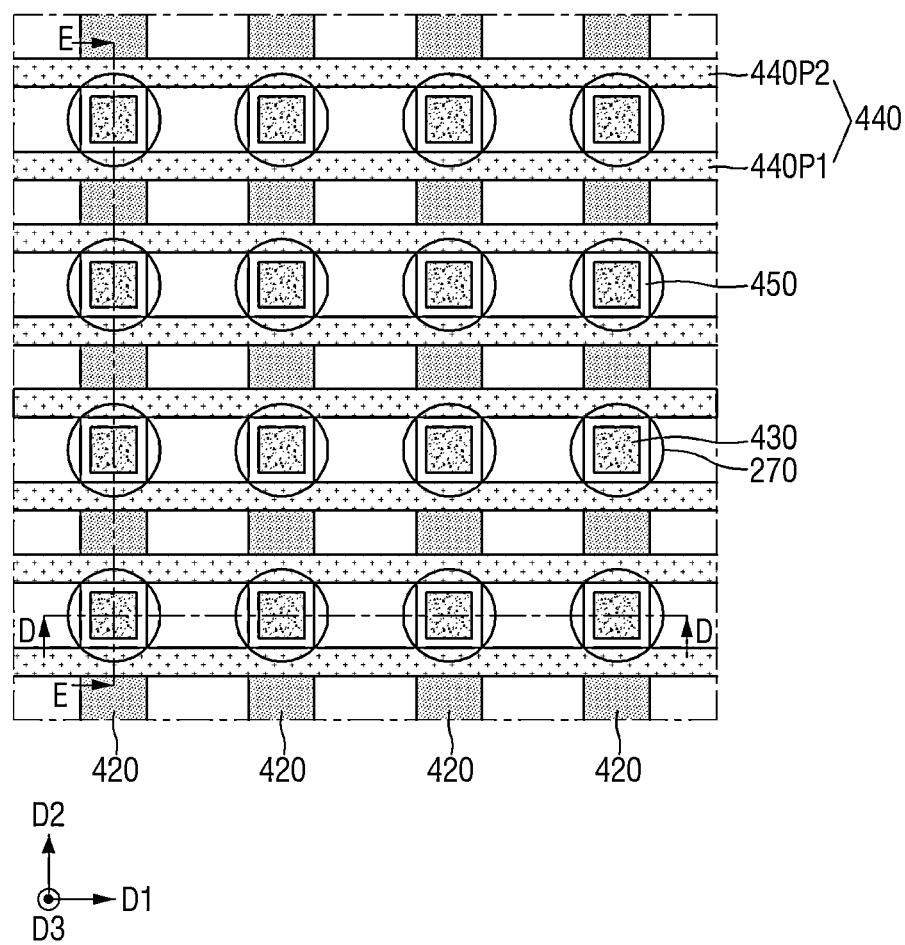
FIG. 29 is a layout diagram for explaining the semiconductor device according to some example embodiments.
Figure 30:
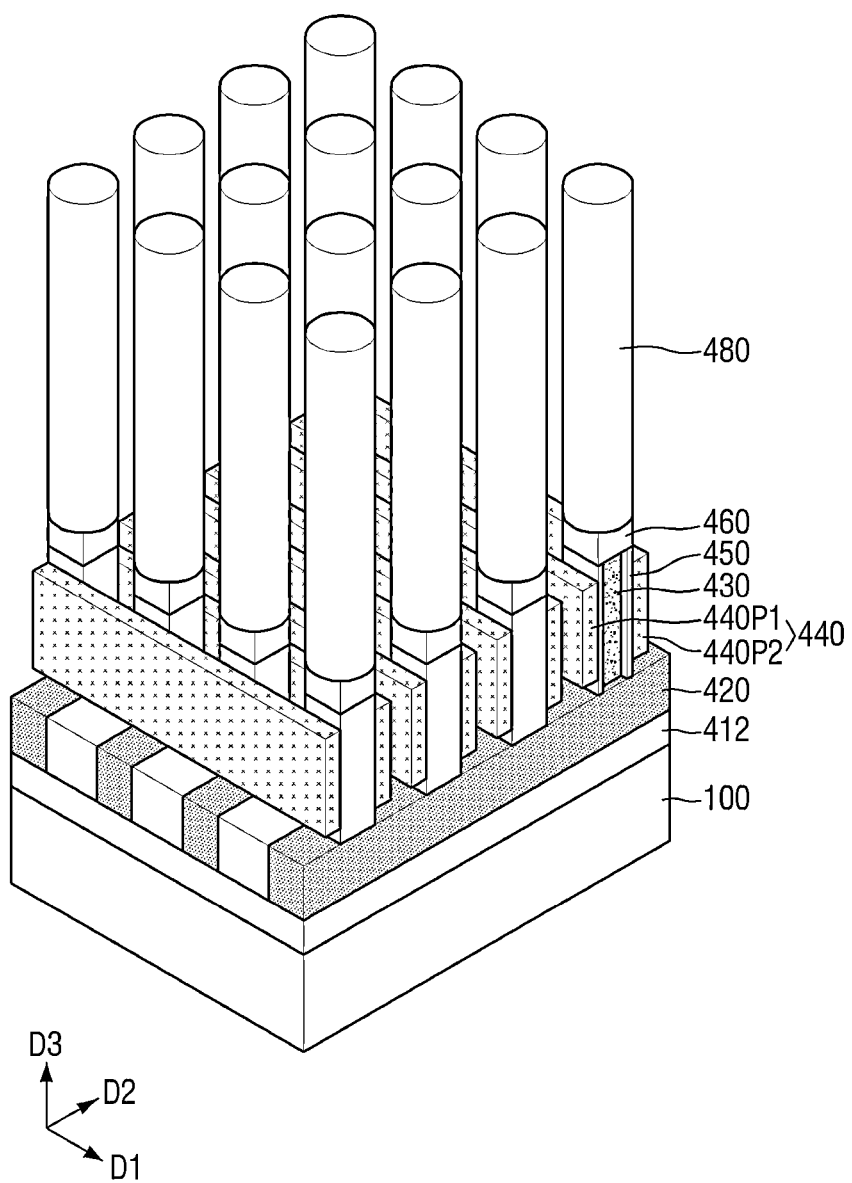
FIG. 30 is a perspective view for explaining the semiconductor device according to some example embodiments.
Figure 31:
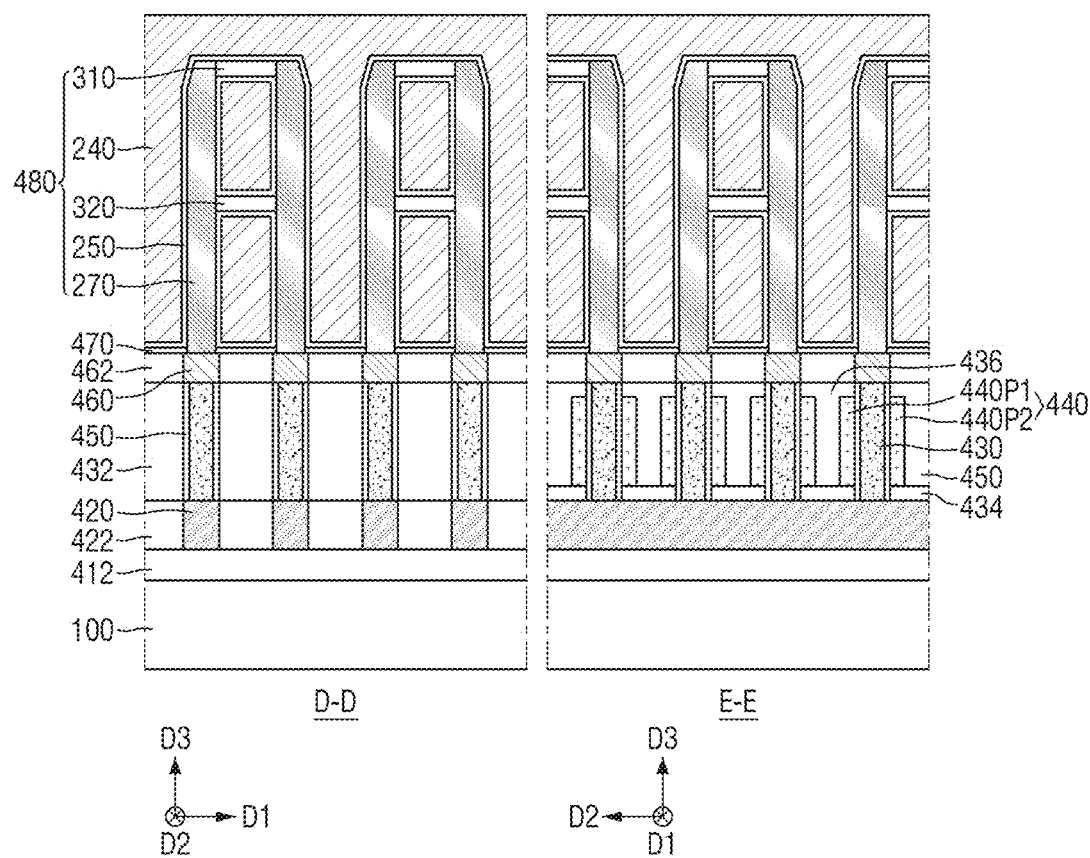
FIG. 31 is a cross-sectional view taken along lines D-D and E-E of FIG. 29.

FIG. 29 is a layout diagram for explaining the semiconductor device according to some example embodiments. FIG. 30 is a perspective view for explaining the semiconductor device according to some example embodiments. FIG. 31 is a cross-sectional view taken along lines D-D and E-E of FIG. 29.

Referring to FIGS. 29 to 31, the semiconductor device may include a substrate 100, a plurality of first conductive lines 420, a channel layer 430, a gate electrode 440, a gate insulating layer 450, and a capacitor structure 480. The semiconductor device of FIGS. 29 to 31 may be a memory device including a vertical channel transistor (VCT). The vertical channel transistor may refer to a structure in which a channel length of the channel layer 430 extends from the substrate 100 along the vertical direction.

The capacitor structure 480 of FIGS. 29 to 31 may be the same as the capacitor structure CS described using FIGS. 1 to 3.

A lower insulating layer 412 may be placed on the substrate 100, and a plurality of first conductive lines 420 may be spaced apart from each other in the first direction D1 and extend in the second direction D2 on the lower insulating layer 412. A plurality of first insulating patterns 422 may be placed on the lower insulating layer 412 to fill the space between the plurality of first conductive lines 420. The plurality of first insulating patterns 422 may extend in the second direction D2, and the upper surfaces of the plurality of first insulating patterns 422 may be placed at the same level as the upper surfaces of the plurality of first conductive lines 420. The plurality of first conductive lines 420 may function as bit lines (columns) of the semiconductor device.

In some example embodiments, the plurality of first conductive lines 420 may include a doped polysilicon, a metal, a conductive metal nitride, a conductive metal silicide, a conductive metal oxide or a combination thereof. For example, the plurality of first conductive lines 420 may be made up of, but not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or a combination thereof. The plurality of first conductive lines 420 may include a single layer or multi-layers of the above-mentioned materials. In some example embodiments, the plurality of first conductive lines 420 may include a two-dimensional semiconductor material, and the two-dimensional semiconductor material may include, for example, graphene, carbon nanotube or a combination thereof.

The channel layers 430 may be arranged in the form of a matrix in which they are placed apart from each other in the first direction D1 and the second direction D2 on the plurality of first conductive lines 420. The channel layer 430 may have a first width along the first direction D1 and a first height along the third direction D3, and the first height may be greater than the first width. For example, the first height may be, but not limited to, about 2 to 10 times the first width. A bottom portion of the channel layer 430 may function as a first source/drain region (not shown), an upper portion of the channel layer 430 may function as a second source/drain region (not shown), and a part of the channel layer 430 between the first and second source/drain regions may function as a channel region (not shown).

In some example embodiments, the channel layer 430 may include an oxide semiconductor, and the oxide semiconductor may include, for example, $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$ or combinations thereof. The channel layer 430 may include a single layer or multi-layers of the oxide semiconductor. In some example embodiments, the channel layer 430 may have a bandgap energy that is greater than bandgap energy of silicon. For example, the channel layer 430 may have bandgap energy of about 1.5 eV to 5.6 eV. For example, the channel layer 430 may have optimum channel performance when having the bandgap energy of about 2.0 eV to 4.0 eV. For example, the channel layer 430 may be, but not limited to, polycrystalline or amorphous. In some example embodiments, the channel layer 430 may include a two-dimensional semiconductor material, and the two-dimensional semiconductor material may include, for example, graphene, carbon nanotube or a combination thereof.

The gate electrode 440 may extend in the first direction D1 on both side walls of the channel layer 430. The gate electrode 440 may include a first sub-gate electrode 440P1 facing a first side wall of the channel layer 430, and a second sub-gate electrode 440P2 facing a second side wall opposite to the first side wall of the channel layer 430. As one channel layer 430 is placed between the first sub-gate electrode 440P1 and the second sub-gate electrode 440P2, the semiconductor device may have a dual gate transistor structure. However, technical ideas of inventive concepts are not limited thereto, and the second sub-gate electrode 440P2 may be omitted, and only the first sub-gate electrode 440P1 facing the first side wall of the channel layer 430 may be formed to implement a single gate transistor structure.

The gate electrode 440 may include doped polysilicon, metal, conductive metal nitride, conductive metal silicide, conductive metal oxide or a combination thereof. For example, the gate electrode 440 may be made up of, but not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or a combination thereof.

The gate insulating layer 450 surrounds the side walls of the channel layer 430 and may be interposed between the channel layer 430 and the gate electrode 440. For example, as shown in FIG. 29, the entire side walls of the channel layer 430 may be surrounded by the gate insulating layer 450, and a part of the side walls of the gate electrode 440 may come into contact with the gate insulating layer 450. In another embodiment, the gate insulating layer 450 extends in an extension direction (that is, the first direction D1) of the gate electrode 440, and only two side walls facing the gate electrode 440 among the side walls of the channel layer 430 may be in contact with the gate insulating layer 450.

In some example embodiments, the gate insulating layer 450 may be made up of a silicon oxide film, a silicon oxynitride film, a high dielectric constant film having a higher dielectric constant than the silicon oxide film, or a combination thereof. The high dielectric constant film may be made up of a metal oxide or a metal oxide nitride. For example, the high dielectric film that may be used as the gate insulating layer 450 may be made up of, but not limited to, $HfO_2$, HfSiO, HfSiON, HfTaO, HfTiO, HfZrO, $ZrO_2$, $Al_2O_3$ or a combination thereof.

A plurality of second insulating patterns 432 may extend along the second direction D2 on the plurality of first insulating patterns 422, and the channel layer 430 may be placed between the two adjacent second insulating patterns 432 among the plurality of second insulating patterns 432. Further, a first embedded layer 434 and a second embedded layer 436 may be placed in a space between the two adjacent channel layers 430, between the two adjacent second insulating patterns 432. The first embedded layer 434 is placed at the bottom portion of the space between the two adjacent channel layers 430, and the second embedded layer 436 may be formed to fill the rest of the space between the two adjacent channel layers 430 on the first embedded layer 434. An upper surface of the second embedded layer 436 is placed at the same level as the upper surface of the channel layer 430, and the second embedded layer 436 may cover the upper surface of the gate electrode 440. In contrast, the plurality of second insulating patterns 432 may be formed of a material layer that is continuous with the plurality of first insulating patterns 422, or the second embedded layer 436 may be formed of a material layer that is continuous with the first embedded layer 434.

Capacitor contacts 460 may be placed on the channel layer 430. The capacitor contacts 460 are placed to vertically overlap the channel layer 430, and may be placed in the form of a matrix in which they are spaced apart from each other in the first direction D1 and the second direction D2. The capacitor contacts 460 may be made up of, but not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or a combination thereof. The upper insulating film 462 may surround the side walls of the capacitor contacts 460 on the plurality of second insulating patterns 432 and the second embedded layer 436.

An etching stop film 470 is placed on the upper insulating layer 462, and a capacitor structure 480 may be placed on the etching stop film 470. The capacitor structure 480 may include a lower electrode 270, a capacitor dielectric film 250, and an upper electrode 240.

The lower electrode 270 penetrates the etching stop film 470 and may be electrically connected to the upper surface of the capacitor contact 460. The lower electrode 270 may be formed, but not limited to, in a pillar type extending in the third direction D3. In some example embodiments, the lower electrodes 270 are placed to overlap perpendicularly to the capacitor contacts 460, and may be arranged in the form of a matrix in which they are spaced apart from each other in the first direction D1 and the second direction D2. In contrast, a landing pad (not shown) is further placed between the capacitor contact 460 and the lower electrode 270, and the lower electrode 270 may be arranged in a hexagonal shape.

Figure 32:
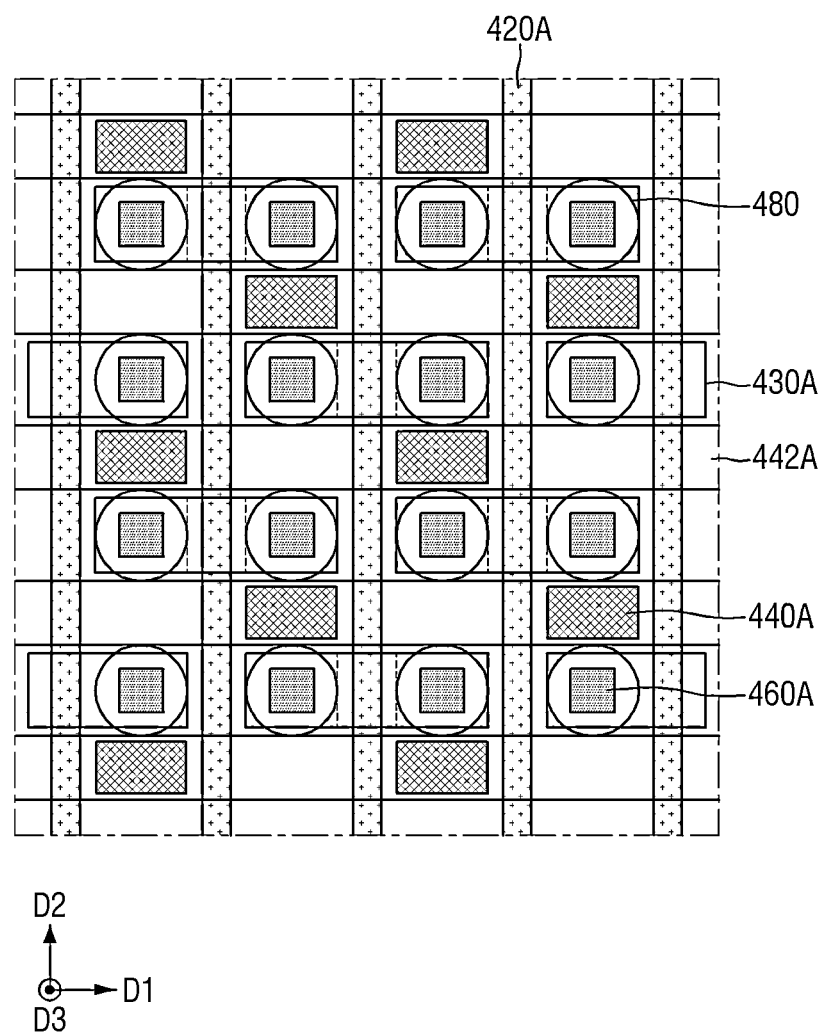
FIG. 32 is a layout diagram for explaining a semiconductor device according to some example embodiments.
Figure 33:
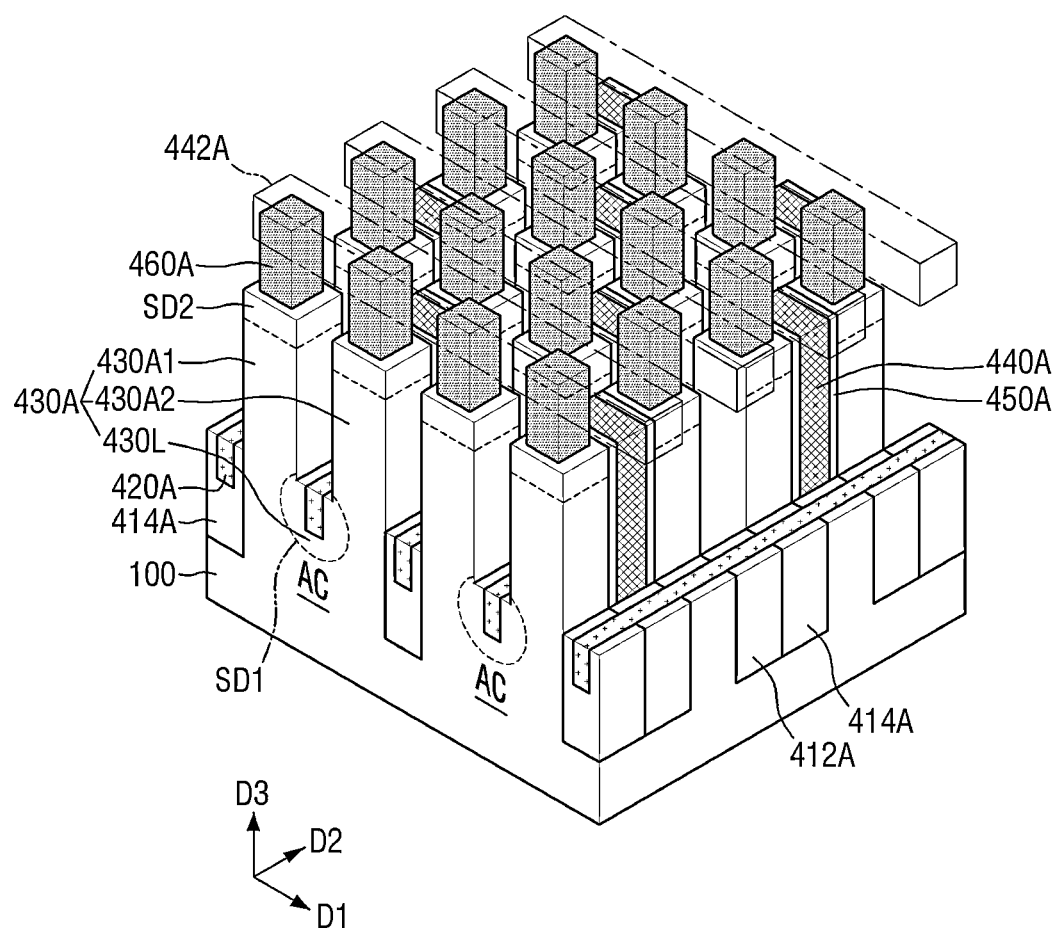
FIG. 33 is a perspective view for explaining the semiconductor device according to some example embodiments.

FIG. 32 is a layout diagram for explaining a semiconductor device according to some example embodiments. FIG. 33 is a perspective view for explaining the semiconductor device according to some example embodiments.

Referring to FIGS. 32 and 33, the semiconductor device may include a substrate 100, a plurality of first conductive lines 420A, a channel structure 430A, a contact gate electrode 440A, a plurality of second conductive lines 442A, and a capacitor structure 480. The semiconductor device may be a memory device that includes a vertical channel transistor (VCT).

A plurality of active regions AC may be defined by the first element separation film 412A and the second element separation film 414A on the substrate 100. The channel structure 430A may be placed in each active region AC, and the channel structure 430A may include a first active pillar 430A1 and a second active pillar 430A2 each extending in the vertical direction, and a connecting portion 430L connected to a bottom portion of the first active pillar 430A1 and a bottom portion of the second active pillar 430A2. A first source/drain region SD1 may be placed inside the connecting portion 430L, and a second source/drain region SD2 may be placed above the first and second active pillars 430A1 and 430A2. The first active pillar 430A1 and the second active pillar 430A2 may each form an independent unit memory cell.

The plurality of first conductive lines 420A may extend in a direction intersecting each of the plurality of active regions AC, and may extend, for example, in the second direction D2. One first conductive line 420A of the plurality of first conductive lines 420A may be placed on the connecting portion 430L between the first active pillar 430A1 and the second active pillar 430A2, and the one first conductive line 420A may be placed on the first source/drain region SD1. The other first conductive line 420A adjacent to one first conductive line 420A may be placed between the two channel structures 430A. One first conductive line 420A of the plurality of first conductive lines 420A may function as a common bit line included in the two unit memory cells formed by the first active pillar 430A1 and the second active pillar 430A2 placed on both sides of the one first conductive line 420A.

One contact gate electrode 440A may be placed between the two channel structures 430A adjacent to each other in the second direction D2. For example, the contact gate electrode 440A may be placed between the first active pillar 430A1 included in one channel structure 430A and the second active pillar 430A2 of the channel structure 430A adjacent thereto. One contact gate electrode 440 may be shared by the first active pillar 430A1 and the second active pillar 430A2 placed on both side walls thereof. A gate insulating layer 450A may be placed between the contact gate electrode 440A and the first active pillar 430A1, and between the contact gate electrode 440A and the second active pillar 430A2. The plurality of second conductive lines 442A may extend in the first direction D1 on the upper surface of the contact gate electrode 440A. The plurality of second conductive lines 442A may function as word lines (rows) of the semiconductor device.

A capacitor contact 460A may be placed on the channel structure 430A. The capacitor contact 460A may be placed on the second source/drain region SD2, and the capacitor structure 480 may be placed on the capacitor contact 460A.

In concluding the detailed description, those of ordinary skill in the art will appreciate that many variations and modifications may be made to the preferred embodiments without substantially departing from the principles of inventive concepts. Therefore, variously described example embodiments of inventive concepts are used in a generic and descriptive sense only and not for purposes of limitation. Example embodiments are not necessarily mutually exclusive with one another. For example, some example embodiments may include one or more features described or uniquely described with reference to one or more figures, and may also include one or more other features described or uniquely described with reference to one or more other figures.

What is claimed is:

1. A semiconductor device comprising:
a first capacitor block including a first conductive plate on a substrate, and a plurality of first lower electrodes on the first conductive plate;
a second capacitor block including a second conductive plate spaced apart from the first conductive plate, and a plurality of second lower electrodes on the second conductive plate;
a separation block including a separation insulating film between the first conductive plate and the second conductive plate, and a plurality of dummy lower electrodes on the separation insulating film; and
a first electrode support supporting the plurality of first lower electrodes, the plurality of second lower electrodes, and the plurality of dummy lower electrodes.

2. The semiconductor device of claim 1, further comprising:
a first edge capacitor block including a plurality of first edge electrodes on the first conductive plate surrounding the first capacitor block,
wherein the first electrode support includes a first penetration pattern that penetrates the first electrode support, and
the first penetration pattern is over the plurality of first lower electrodes and is not over the plurality of first edge electrodes.

3. The semiconductor device of claim 2, further comprising:
a second edge capacitor block including a plurality of second edge electrodes on the second conductive plate surrounding the second capacitor block,
wherein the first penetration pattern is over the plurality of second lower electrodes and is not over the plurality of second edge electrodes.

4. The semiconductor device of claim 1, wherein the first electrode support includes a first penetration pattern penetrating the first electrode support and the first penetration pattern over the plurality of first lower electrodes and the plurality of second lower electrodes, and
the first penetration pattern is not over the plurality of dummy lower electrodes.

5. The semiconductor device of claim 1, further comprising:
a first edge capacitor block including a plurality of first edge electrodes on the first conductive plate surrounding the first capacitor block; and
a second edge capacitor block including a plurality of second edge electrodes on the second conductive plate surrounding the second capacitor block,
wherein the first electrode support includes a first penetration pattern penetrating the first electrode support, and the first penetration pattern is over the plurality of first lower electrodes and the plurality of second lower electrodes,
the first capacitor block includes a first surface facing the separation block, and the second capacitor block includes a second surface facing the separation block,
the first penetration pattern is over the plurality of first edge electrodes, the plurality of second edge electrodes, and the plurality of dummy lower electrodes between the first surface of the first capacitor block and the second surface of the second capacitor block,
the first penetration pattern is not over the plurality of first edge electrodes in the first edge capacitor block other than the plurality of first edge electrodes in the first edge capacitor block facing the first surface of the first capacitor block, and
the first penetration pattern is not over the plurality of second edge electrodes in the second edge capacitor block other than the plurality of second edge electrodes in the second edge capacitor block facing the second surface of the second capacitor block.

6. The semiconductor device of claim 1, further comprising:
a capacitor dielectric film extending along profiles of the plurality of first lower electrodes, the plurality of second lower electrodes, the plurality of dummy lower electrodes, upper surfaces of the first electrode support, and lower surfaces of the first electrode support; and
an upper electrode on the capacitor dielectric film.

7. The semiconductor device of claim 1, further comprising:
a second electrode support supporting the plurality of first lower electrodes, the plurality of second lower electrodes, and the plurality of dummy lower electrodes,
wherein
the second electrode support is between the first conductive plate and the first electrode support,
the second electrode support is further between the second conductive plate and the first electrode support, and
the second electrode support is further between the separation insulating film; and the first electrode support.

8. The semiconductor device of claim 1, wherein uppermost surfaces of the plurality of first lower electrodes, uppermost surfaces of the plurality of second lower electrodes, and uppermost surfaces of the plurality of dummy lower electrodes are coplanar with an uppermost surface of the first electrode support.

9. The semiconductor device of claim 1, further comprising:
a first contact connected to the first conductive plate, and the first contact spaced apart from the plurality of first lower electrodes; and
a second contact connected to the second conductive plate, and the second contact spaced apart from the plurality of second lower electrodes.

10. The semiconductor device of claim 1, wherein the plurality of first lower electrodes, the plurality of second lower electrodes, and the plurality of dummy lower electrodes have a pillar shape extending in a thickness direction of the substrate.

11. The semiconductor device of claim 1, wherein
a first interval is between a first lower electrode closest to the separation block and a first dummy lower electrode of the plurality of dummy lower electrodes,
a second interval is between a second lower electrode closest to the separation block and a second dummy lower electrode of the plurality of dummy lower electrodes, and
the first interval is a same interval as the second interval.

12. A semiconductor device comprising:
a first capacitor block including a first conductive plate on a substrate, and a plurality of first lower electrodes on the first conductive plate;
a second capacitor block including a second conductive plate spaced apart from the first conductive plate, and a plurality of second lower electrodes on the second conductive plate;
a first edge capacitor block including a plurality of first edge electrodes on the first conductive plate surrounding the first capacitor block;
a second edge capacitor block including a plurality of second edge electrodes on the second conductive plate surrounding the second capacitor block; and a first electrode support supporting the plurality of first lower electrodes, the plurality of second lower electrodes, the plurality of first edge electrodes, and the plurality of second edge electrodes,
wherein the first electrode support includes
a first penetration pattern penetrating the first electrode support, and
the first penetration pattern is over the plurality of first lower electrodes and the plurality of second lower electrodes, and
the first penetration pattern is not over the plurality of first edge electrodes and the plurality of second edge electrodes.

13. The semiconductor device of claim 12, further comprising:
a separation block between the first capacitor block and the second capacitor block including a separation insulating film between the first conductive plate and the second conductive plate, and
a plurality of dummy lower electrodes on the separation insulating film.

14. The semiconductor device of claim 13, wherein the first penetration pattern is not over the plurality of dummy lower electrodes.

15. The semiconductor device of claim 13, wherein
a first distance is between a first edge electrode of the plurality of first edge electrodes and a first dummy lower electrode of the plurality of dummy lower electrodes adjacent to the first edge electrode,
a second distance is between the first dummy lower electrode of the plurality of dummy lower electrodes and a second dummy lower electrode of the plurality of dummy lower electrodes adjacent to the first dummy lower electrode,
a third distance is between the second dummy lower electrode of the plurality of dummy lower electrodes and a second edge electrode of the plurality of second edge electrodes adjacent to the second dummy lower electrode, and
the first distance, the second distance, and the third distance are all a same distance.

16. The semiconductor device of claim 12, further comprising:
a capacitor dielectric film extending along profiles of the plurality of first lower electrodes, profiles of the plurality of second lower electrodes, profiles of the plurality of first edge electrodes, profiles of the plurality of second edge electrodes, upper surfaces of the first electrode support, and lower surfaces of the first electrode support; and
an upper electrode on the capacitor dielectric film.

17. The semiconductor device of claim 16, further comprising:
an etching stop film between the first conductive plate and the capacitor dielectric film, and
the etching stop film is further between the second conductive plate, and the capacitor dielectric film.

18. A semiconductor device comprising:
a first capacitor block including a first conductive plate on a substrate, and a plurality of first lower electrodes on the first conductive plate;
a second capacitor block including a second conductive plate spaced apart from the first conductive plate, and a plurality of second lower electrodes on the second conductive plate;

a first edge capacitor block including a plurality of first edge electrodes on the first conductive plate surrounding the first capacitor block;

a second edge capacitor block including a plurality of second edge electrodes on the second conductive plate surrounding the second capacitor block;

a separation block including a separation insulating film between the first conductive plate and the second conductive plate, and the separation block including a plurality of dummy lower electrodes on the separation insulating film;

a first electrode support supporting the plurality of first lower electrodes, the plurality of second lower electrodes, the plurality of first edge electrodes, the plurality of second edge electrodes, and the plurality of dummy lower electrodes, and the first electrode support including a first penetration pattern; and a second electrode support supporting the plurality of first lower electrodes, the plurality of second lower electrodes, the plurality of first edge electrodes, the plurality of second edge electrodes, and the plurality of dummy lower electrodes, the second electrode support including a second penetration pattern completely overlapping the first penetration pattern, and the second electrode support is between the substrate and the first electrode support, wherein the first penetration pattern is over the plurality of first lower electrodes and the plurality of second lower electrodes, and the first penetration pattern is not over the plurality of first edge electrodes, the plurality of second edge electrodes, and the plurality of dummy lower electrodes.

19. The semiconductor device of claim 18, wherein uppermost surfaces of each of the plurality of first lower electrodes, the plurality of second lower electrodes, the plurality of first edge electrodes, the plurality of second edge electrodes, and the plurality of dummy lower electrodes are coplanar with an uppermost surface of the first electrode support.

20. The semiconductor device of claim 18, further comprising:

an etching stop film between the plurality of first lower electrodes and the plurality of dummy lower electrodes, the etching stop film is further between the plurality of second lower electrodes and the plurality of dummy lower electrodes, the etching stop film is further between the plurality of first edge electrodes and the plurality of dummy lower electrodes, the etching stop film is further between the plurality of second edge electrodes, and the plurality of dummy lower electrodes, and the etching stop film on the first conductive plate, the second conductive plate, and the separation insulating film;

a capacitor dielectric film extending along profiles of the plurality of first lower electrodes, the plurality of second lower electrodes, the plurality of first edge electrodes, the plurality of second edge electrodes, the plurality of dummy lower electrodes, upper surfaces of the first electrode support, lower surfaces of the first electrode support, upper surfaces of the second electrode support, and lower surfaces of the second electrode support, and the capacitor dielectric film is on the etching stop film; and an upper electrode on the capacitor dielectric film, wherein the upper electrode extends from an uppermost surface of the capacitor dielectric film toward the substrate in the first capacitor block and the second capacitor block, and the upper electrode does not extend from the uppermost surface of the capacitor dielectric film toward the substrate, in the first edge capacitor block and the second edge capacitor block.

* * * * *